(12) United States Patent
Tsuyoshi et al.

(10) Patent No.: US 6,414,417 B1
(45) Date of Patent: Jul. 2, 2002

(54) LAMINATED PIEZOELECTRIC ACTUATOR

(75) Inventors: Hirotaka Tsuyoshi; Hideki Uchimura; Shigenobu Nakamura; Susumu Ono, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/653,091

(22) Filed: Aug. 31, 2000

(30) Foreign Application Priority Data

| Aug. 31, 1999 | (JP) | 11-245348 |
| Aug. 31, 1999 | (JP) | 11-246640 |
| Nov. 11, 1999 | (JP) | 11-321071 |
| Jan. 26, 2000 | (JP) | 2000-021823 |

(51) Int. Cl.$^7$ .......................................... H01L 41/083
(52) U.S. Cl. ..................................................... 310/366
(58) Field of Search ................................ 310/366, 363

(56) References Cited

U.S. PATENT DOCUMENTS

| 5,175,465 A | * | 12/1992 | Um et al. ..................... 310/328 |
| 5,245,734 A | * | 9/1993 | Issartel ....................... 29/25.35 |
| 5,252,883 A | * | 10/1993 | Kondo ......................... 310/328 |
| 5,254,212 A | * | 10/1993 | Someji et al. ................ 216/20 |
| 5,266,862 A | * | 11/1993 | Ohya .......................... 310/328 |
| 5,406,164 A | * | 4/1995 | Okawa et al. ................. 310/328 |
| 5,459,371 A | * | 10/1995 | Okawa et al. ................. 310/328 |
| 5,932,951 A | * | 8/1999 | Unami ......................... 310/315 |
| 6,091,180 A | * | 7/2000 | Unami et al. ................. 310/328 |
| 6,104,129 A | * | 8/2000 | Okamoto ...................... 310/366 |
| 6,111,343 A | * | 8/2000 | Unami et al. ................. 310/328 |

FOREIGN PATENT DOCUMENTS

| JP | 09153649 A | * | 6/1997 | H01L/41/22 |
| JP | 2000133851 A | * | 5/2000 | H01L/41/083 |
| JP | 2001102647 A | * | 4/2001 | H01L/41/083 |
| JP | 2001210886 A | * | 8/2001 | H01L/41/083 |
| JP | 2001244513 A | * | 9/2001 | H01L/41/083 |
| JP | 2001244514 A | * | 9/2001 | H01L/41/083 |

* cited by examiner

*Primary Examiner*—Nestor Ramirez
*Assistant Examiner*—Peter Medley
(74) *Attorney, Agent, or Firm*—Hogan & Hartson, L.L.P.

(57) ABSTRACT

A laminated piezoelectric actuator comprising external electrodes formed on the side surfaces of an actuator body constituted by plural piezoelectric layers and plural internal electrode layers alternatingly laminated in the direction of height, external electrodes connecting the ends of said internal electrode layers, the internal electrode layers neighboring one another with the piezoelectric layers sandwiched among them of one side constituting first electrode layers and the internal electrode layers of the other side constituting second electrode layers, wherein the external electrodes include a first external electrode connecting the ends of the first electrode layers, and a second external electrode connecting the ends of the second electrode layers and is formed on a side surface of the actuator body different from the side surface on where the first external electrode is formed, insulating blocks are arranged between the first external electrode and the ends of the second electrode layers, and between the second external electrode and the ends of the first electrode layers, flat surfaces are formed on the side surfaces of the insulating blocks that are in contact with the ends of the first electrode layers and with the ends of the second electrode layers, the flat surfaces extending in parallel with the side surfaces of said actuator body, and, when the thickness of the internal electrode layers is denoted by $t_1$, the thickness of the piezoelectric layers by $t_2$, and the length of the flat surfaces by L, a relation represented by the following formula, $$0.2 \leq (L-t_1)/t_2 < 1$$

is satisfied.

15 Claims, 9 Drawing Sheets

COMMON RATIO (mm) AMONG THE THICKNESSES OF
THE PIEZOELECTRIC MEMBERS IN THE STRESS-RELAXING
PORTION

LAMINATED PIEZOELECTRIC ACTUATOR

BACKGROUND OF THE INVENTION

1. Field of the Invention

The present invention relates to a laminated piezoelectric actuator and, more specifically, to a laminated piezoelectric actuator used, for example, as a precision positioning device in an optical equipment, as a drive element for preventing vibration and as a drive element for fuel injection in an automotive engine.

2. Description of the Prior Art

There has heretofore been known a laminated piezoelectric actuator comprising a laminate in which plural pieces of piezoelectric layers and plural pieces of internal electrode layers are alternatingly laminated one upon the other. In the piezoelectric actuator of the above-mentioned type, a voltage is applied to the internal electrode layers among which the piezoelectric layers are sandwiched to obtain a large displacement by utilizing the inverse piezoelectric effect that occurs in the piezoelectric layers.

In the laminated piezoelectric actuator, the internal electrode layer laminated on one surface of the piezoelectric layer is used as a first electrode (e.g., positive electrode) and the internal electrode layer laminated on the other surface thereof is used as a second electrode (e.g., negative electrode); i.e., a partial electrode structure is employed in which the internal electrode layers have areas smaller than the areas of the piezoelectric layers.

FIG. 12 is a side sectional view illustrating a conventional laminated piezoelectric actuator having the partial electrode structure, in which plural piezoelectric layers 1 and internal electrode layers 2 are alternatingly laminated to form an actuator body 3, and a pair of external electrodes 4 and 4 are formed on the side surfaces thereof.

As will be obvious from FIG. 12, plural internal electrode layers 2 include first internal electrode layers 2a and second internal electrode layers 2b that are alternatingly laminated one upon the other, and the ends of the first internal electrode layers 2a and the ends of the second internal electrode layers 2b are electrically connected to the external electrode terminals 4a and 4b that are formed on different side surfaces of the actuator body 3. That is, the external electrode 4a is electrically connected to the ends of the first internal electrode layers 2a but is not connected to the ends of the second internal electrode layers 2b. Similarly, the external electrode 4b is electrically connected to the ends of the second internal electrode layers 2b but is not connected to the ends of the first internal electrode layers 2a. Further, the piezoelectric layers sandwiched among the first internal electrode layers 2a and the second internal electrode layers 2b are polarized in the directions of arrows as shown.

Japanese Unexamined Patent Publication (Kokai) No. 147880/1989 discloses a laminated piezoelectric actuator having a structure as shown in FIG. 12, in which insulating blocks of a suitable shape are provided between the external electrode 4a and the second internal electrode layers 2b, and between the external electrode 4b and the first internal electrode layers 2a. The insulating blocks prevent electric conduction between the external electrode 4a and the second internal electrode layers 2b, and between the external electrode 4b and the first internal electrode layers 2a.

In the laminated piezoelectric actuator of the partial electrode structure shown in FIG. 12, however, distortion occurs due to the inverse piezoelectric effect in the portion where the first internal electrode layer 2a and the second internal electrode layer 2b are overlapped one upon the other (portions where the piezoelectric layers 1 are held by the internal electrode layers 2), but no inverse piezoelectric effect occurs near the side surfaces of the actuator body 3 where the piezoelectric layers 1 are not held by the internal electrode layers 2, and the actuator as a whole produces a small amount of displacement.

In each piezoelectric layer 1, further, distortion due to the inverse piezoelectric effect becomes nonuniform, and stress concentrates near the end of the internal electrode layer 2. Due to the concentration of stress, cracks spread from the end of the internal electrode layer 2 into the piezoelectric layer 1, causing the piezoelectric layer 1 to be broken (for example, see Destruction Mechanisms in Ceramic Multi-layer Actuators: Japan Journal Appl. Physics, Vol. 33 (1994), pp. 3091–3094).

In the piezoelectric actuator disclosed in Japanese Unexamined Patent Publication (Kokai) No. 147880/1989, further, the electric field concentrates conspicuously at the end of the internal electrode layer located near the insulating block, stress concentrates inside the piezoelectric layer or in the interface between the piezoelectric layer and the internal electrode layer, causing a mechanical destruction in the actuator body or a destruction in the insulation of the insulating block and, hence, causing the life to be shortened.

SUMMARY OF THE INVENTION

It is therefore an object of the present invention to provide a laminated piezoelectric actuator which very little permits the occurrence of insulation breakdown and mechanical break down, and is highly reliable featuring a long life.

According to the present invention, there is provided a laminated piezoelectric actuator comprising (a) an actuator body constituted by plural piezoelectric layers and plural internal electrode layers alternatingly laminated in the direction of height, the internal electrode layers of one side constituting first electrode layers and the internal electrode layers of the other side constituting second electrode layers so as to be neighbored one another with the piezoelectric layers sandwiched among them, (b) external electrodes which are formed on the side surfaces of the actuator body and are connecting the ends of the internal electrode layers, and (c) non-active ceramic layers arranged at an upper end and a lower end of the actuator body; wherein the external electrodes include a first external electrode connecting the ends of the first electrode layers, and a second external electrode connecting the ends of the second electrode layers and is formed on a side surface of the actuator body different from the side surface on where the first external electrode is formed;

insulating blocks are arranged between the first external electrode and the ends of the second electrode layers, and between the second external electrode and the ends of the first electrode layers;

flat surfaces are formed on the side surfaces of the insulating blocks that are in contact with the ends of the first electrode layers and with the ends of the second electrode layers, the flat surfaces extending in parallel with the side surfaces of the actuator body; and when the thickness of the internal electrode layers is denoted by $t_1$, the thickness of the piezoelectric layers by $t_2$, and the length of the flat surfaces by L, a relation represented by the following formula, $$0.2 \leq (L - t_1)/t_2 < 1$$

is satisfied.

That is, the present invention was accomplished by giving attention to the fact that the concentration of the electric field is seriously affected by the shape of the insulating blocks and, particularly, by the shape of the interface between the insulating blocks and the internal electrodes. By forming the insulating blocks in a shape to satisfy the conditions of the above-mentioned formula (1), it is allowed to lower the degree of concentration of the electric field in the piezoelectric layers near the ends of the internal electrode layers located close to the side surfaces of the insulating blocks and, hence, to effectively prevent the breakdown in the insulation of the insulating blocks caused by the concentration of the electric field. Further, the concentration of stress is effectively prevented in the piezoelectric layers or in the internal electrode layers, that is caused by the concentration of the electric field making it possible to effectively prevent the mechanical breakdown of the actuator body. Thus, the present invention enhances the reliability of the laminated piezoelectric actuator and extends the life.

According to the present invention, it is desired to form external electrodes by using an electrically conducting composition which comprises a resin matrix of a heat-resistant resin having a 5%-weight-reduction temperature of not lower than 250° C. and at least one kind of electrically conducting agent selected from the group consisting of electrically conducting ceramics, a metal oxide, and a metal of the group of 6 to 11 of periodic table or an alloy thereof. Upon forming the external electrodes by using such an electrically conducting composition, it is allowed to effectively prevent the breakage of connection between the internal electrode layers and the external electrodes caused by the expansion and contraction of the piezoelectric layers during the operation and by a difference in the thermal expansion between the piezoelectric layers and the internal electrode layers and, hence, to obtain a laminated piezoelectric actuator having excellent durability.

Non-active ceramic layers are provided at an upper end and a lower end of the actuator body to maintain the strength and to transmit the displacement of the actuator to the external side. When the actuator is energized, the actuator body expands and contracts but the non-active ceramic layers neither expand nor contract. Accordingly, shearing stress builds up in the boundary portions between the ceramic layers and the actuator body to deteriorate the durability of the actuator. According to the present invention, the actuator body is divided into three regions along the direction of lamination, i.e., into a central portion and stress-relaxing portions over and under the central portions, the non-active ceramic layers are provided neighboring the stress-relaxing portions, and the thickness of the piezoelectric layer included in the stress-relaxing portion is selected to be larger than the thickness of the piezoelectric layer in the central portion in order to suppress the shearing stress occurring in the boundary portion between the non-active ceramic layers and the actuator body and to improve durability of the actuator.

BRIEF DESCRIPTION OF THE DRAWINGS

FIGS. 1a and 1b are views illustrating a laminated piezoelectric actuator of the present invention, wherein FIG. 1a is a plan view and FIG. 1b is a sectional view along A—A in FIG. 1;

DETAILED DESCRIPTION OF THE INVENTION (Structure of the laminated piezoelectric actuator).

Figure 1A:
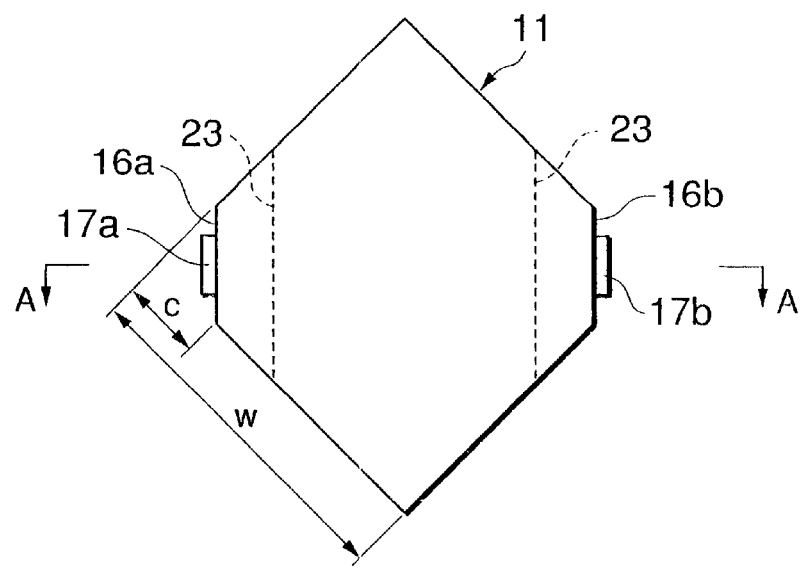
Figure 1B:
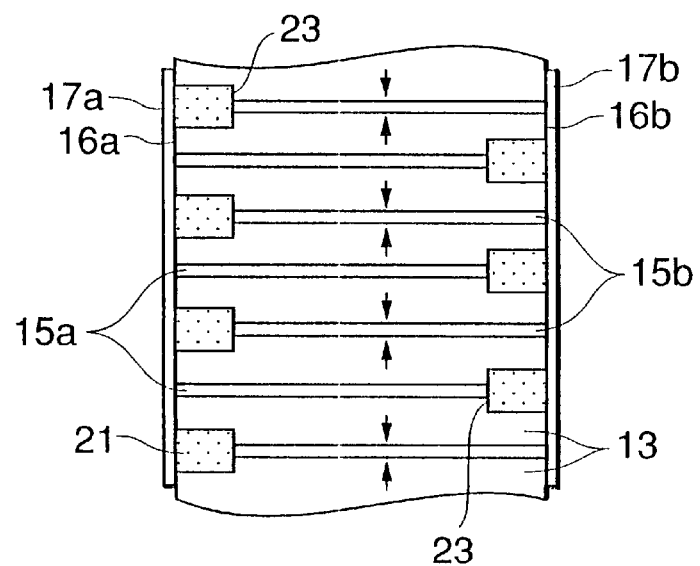

FIGS. 1a and 1b are views illustrating a laminated piezoelectric actuator of the present invention, wherein FIG. 1a is a plan view and FIG. 1b is a sectional view along A—A in FIG. 1;

In FIGS. 1a and 1b, the actuator body 11 has a hexagonal cylindrical shape and is constituted by plural piezoelectric layers 13 and plural internal electrode layers 15 that are alternatingly laminated one upon the other. External electrodes 17 are formed on the outer surfaces of portions of the actuator body 11.

The ends of the internal electrode layers 15 are exposed to the six side surfaces of the actuator body 11. The piezoelectric layer 13 located on the upper side of one internal electrode layer 15 and the piezoelectric layer 13 located on the lower side of the above one internal electrode layer 15 are polarized in the opposite directions relative to each other, i.e., are polarized in the directions of arrow as shown in FIG. 1b.

The internal electrode layers 15 include first internal electrode layers 15a and second internal electrode layers 15b which are alternatingly laminated. Different potentials are given to the first internal electrode layers 15a and to the second internal electrode layers 15b to apply an electric field to the piezoelectric layers 13 in the direction of thickness, so that the piezoelectric layers 13 undergo displacement.

Though not shown in FIGS. 1a and 1b, non-active ceramic layers are joined to the upper end and to the lower end of the actuator body 11 to mechanically hold the actuator body 11 and to transmit the force produced by the displacement of the piezoelectric layers 13 to the outer side.

The actuator body 11 is formed by chamfering the two opposing side corners of the square pole. The side surfaces (hereinafter often called side surfaces for forming external electrodes) 16a and 16b formed by chamfering have areas smaller than the areas of other side surfaces, and the external electrodes 17 are formed on these side surfaces 16a and 16b. As will be obvious from FIG. 1b, the external electrodes 17 include a first external electrode 17a formed on the side surface 16 for forming the external electrode, and a second external electrode 17b formed on the side surface 16b for forming the external electrode. The external electrode 17a (first external electrode) is connected to the ends of the first internal electrode layers 15a but is insulated from the ends of the second internal electrode layers 15b. The external electrode 17b (second external electrode) is connected to the second internal electrode layers 15b but is insulated from the ends of the first internal electrode layers 15a. That is, the ends of the first internal electrode layers 15a are exposed to the side surface 16a for forming the external electrode of the actuator body 11, and the first external electrode 17a is electrically connected to the ends of the first internal electrode layers 15a, but to which the ends of the second internal electrode layers 15b are not exposed but insulating blocks 21 are arranged between the first external electrode 17a and the ends of the second internal electrode layers 15b. On the other hand, the ends of the second internal electrode layers 15b are exposed to the side surface 16b for forming the external electrode, and the second external electrode 17b is electrically connected to the ends of the second internal electrode layers 15b, but to which the ends of the first internal electrode layers 15a are not exposed but insulating blocks 21 are arranged between the second external electrode 17b and the ends of the first internal electrode layers 15a. Thus, the ends of the first internal electrode layers 15a only are electrically connected to the first external electrode 17a, and the ends of the second internal electrode layers 15b only are electrically connected to the second external electrode 17b. In FIG. 1a, the interface between the insulating block 21 and the first internal electrode layers 15a or the second internal electrode layers 15b is designated at 23.

The insulating blocks 21 are formed at the abovementioned positions by, for example, firing a laminate of the piezoelectric layers 13 and the internal electrode layers 15, effecting, as required, the chamfering to form the side surfaces 16a and 16b for forming the external electrodes, mechanically forming recessed portions of a shape corresponding to the blocks 21 at positions where the insulating blocks 21 are to be formed, and filling the recessed portions with an insulator.

Figure 2A:
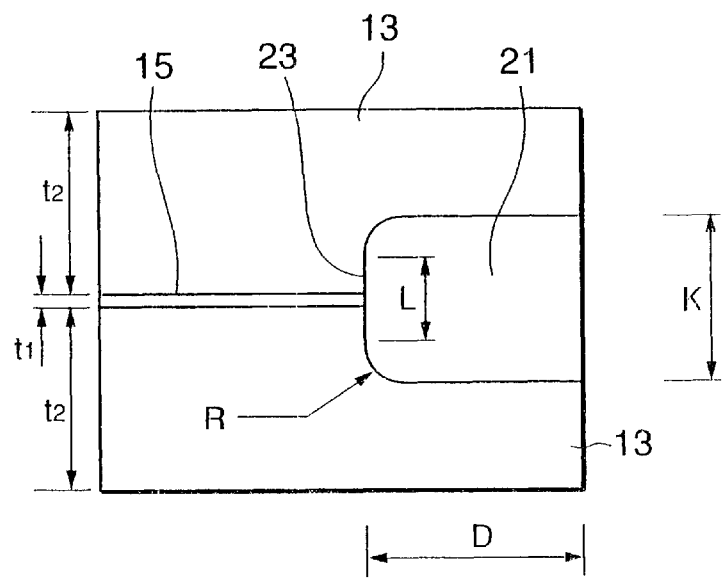
FIG. 2a is a side sectional view illustrating, on an enlarged scale, an interface between an insulating block and an internal electrode layer.

As will be obvious from FIG. 2a illustrating, on an enlarged scale, the interface between the insulating block 21 and the internal electrode layer 15 (first internal electrode layer 15a or second internal electrode layer 15b), the insulating block 21 according to the invention has a thickness K larger than the thickness $t_1$ of the internal electrode layer 15 and, besides, the side surface of the insulating block 21 has a flat surface 23 extending in parallel with the side surface 16a or 16b of the actuator body 11, and an end of the internal electrode layer 15 is connected to the central portion of the flat surface 23. That is, the flat surface 23 forms an interface between the internal electrode layer 15 (first internal electrode layer 15a or second internal electrode layer 15b) and the insulating block 21.

In the laminated piezoelectric actuator of the present invention, when the length of the flat surface 23 is denoted by L, the thickness of the internal electrode layer 15 by $t_1$ and the thickness of the piezoelectric layer 13 by $t_2$, the shape of the side surface of the insulating block 21 is so set as to satisfy the formula (1), $$0.2 \leq (L-t_1)/t_2 < 1 \tag{1}$$

It is desired that the value $(L-t_1)/t_2$ (hereinafter called ratio of the thicknesses of the effective interfaces) is not smaller than 0.4 and, most desirably, not smaller than 0.6.

That is, when the ratio of the thicknesses of the effective interfaces on the side surface of the insulating block 21 is smaller than the above-mentioned range, stress concentrates in a portion of the piezoelectric layer 13 located near the end of the internal electrode layer 15 that is in contact with the insulating block 21, and cracks develop in this portion often resulting in the breakage as will be demonstrated by Experimental Examples appearing later.

When the ratio of the thicknesses of the effective interfaces is larger than the above-mentioned range, on the other hand, the difference $K-t_1$ between the thickness K of the insulating block 21 and the thickness $t_1$ of the internal electrode layer 15 becomes greater than the thickness $t_2$ of the piezoelectric layer 13. When a recessed portion is formed in the side surface of the actuator body 11 for forming the insulating block 21, therefore, the portion that is removed becomes larger than the portion that is left in the side surface of the piezoelectric layer 13, whereby the strength of the piezoelectric layer 13 decreases and the actuator body 11 tends to be broken at the time of forming the recessed portion.

It is further desired that the depth (designated at D in FIG. 2a) of the insulating block 21 is greater than the thickness $t_2$ of the piezoelectric layer. That is, when $D > t_2$, the distance between the end of the internal electrode layer 15 and the external electrode 17 becomes greater than a gap among the neighboring internal electrode layers 15, whereby the electric insulating property is improved, and the insulation breakdown of the insulating block 21 is effectively prevented.

Figure 2B:
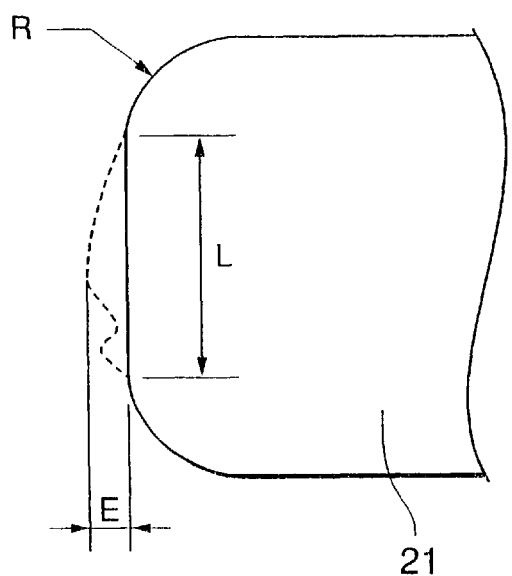
FIG. 2b is a side sectional view illustrating the interface on a further enlarged scale.

Ideally, further, it is desired that the flat surface 23 is perfectly flat. As will be obvious from FIG. 2b which illustrates the interface between the insulating block 21 and the internal electrode layer 15 on a further enlarged scale, however, there really exists a machining error E and ruggedness is formed to some extent. In the present invention, it is regarded that the flat surface 23 is substantially flat when the ratio (relative machining error) E/L of the machining error E to the length L of the flat surface 23 is not larger than ±17% and, particularly, not larger than ±8%.

In the present invention, further, it is desired that the ratio of the dielectric constant $\varepsilon_2$ of the insulating material 21 to the dielectric constant $\varepsilon_1$ in the polarizing direction of the piezoelectric layer 13, satisfies the following formula (2), $$\varepsilon_2/\varepsilon_1 < 1 \tag{2}$$

from the standpoint of lowering the concentrated electric field value in the piezoelectric layer 13 positioned near the interface between the insulating block 21 and the internal electrode layer 15. In particular, it is desired that the ratio of dielectric constants is not larger than 0.1 from the standpoint of preventing the concentration of electric field in the internal electrode layer 15.

In the present invention, further, it is desired that the radius R of curvature at a corner where the upper surface or the lower surface of the insulating block 21 is continuous to the flat surface 23, satisfies the following formula (3), $$0.05t_2 \leq R \leq 0.3t_2 \qquad (3)$$

where $t_2$ is the thickness of the piezoelectric layers 13.

In forming a recessed portion in the side surface of the actuator body to form the insulating block 21 by being filled with the insulator, when the radius R of curvature of the corner portion (i.e., corner of the recessed portion) of the insulating block 21 is selected to satisfy the formula (3), occurrence of cracks from the corner portion into the piezoelectric layer 13 is effectively prevented. This is also advantageous since the length L of the flat surface 23 can be set to be not shorter than $0.4 t_2$.

In the present invention, the piezoelectric material for forming the piezoelectric layer 13 will be a piezoelectric ceramic material comprising chiefly lead titanate zirconate Pb(Zr, Ti)O$_3$ (hereinafter abbreviated as PZT) or barium titanate BaTiO$_3$. Not being limited thereto only, however, any ceramic material can be used provided it exhibits piezoelectric property. It is desired that the thickness of the piezoelectric layer 13, i.e., the gap between the first internal electrode layer 15$a$ and the second internal electrode layer 15$b$ is in a range of from 0.05 to 0.25 mm from the standpoint of decreasing the size of the actuator and applying a high electric field.

As the electrode material for forming the internal electrode layers 15, there can be suitably used a metal or a metal alloy having good electric conducting property, such as silver, silver-platinum or silver-palladium from the standpoint of effecting the firing simultaneously with the piezoelectric ceramics. It is further desired that the thickness of the internal electrode layer 15 is usually in a range of from about 2 to about 10 µm.

As the insulating material for forming the insulating block 21, there can be used the one having a high electric resistance (having a volume resistivity of not smaller than $10^{12}$ Ω-cm), such as glass, epoxy resin, polyimide resin, polyamideimide resin, or silicone rubber. In the present invention, however, the silicone rubber is particularly preferably used. From the standpoint of suppressing the stress building up in the piezoelectric layer 13 due to the rigidity of the insulating block 21, further, it is desired that a modulus of longitudinal elasticity $Y_2$ of the insulating block is very smaller than a modulus of longitudinal elasticity $Y_1$ of the piezoelectric layer 13. For example, it is desired that the ratio of moduli of longitudinal elasticity satisfies the following formula (4), $$Y_2/Y_1 < 1 \qquad (4)$$

In particular, it is most desired that the ratio of moduli of longitudinal elasticity is not larger than 0.1.

The external electrodes 17 can be formed of a metal having excellent resistance against oxidation, such as Ni or Ag, or can be formed of various electrically conducting resin. It is, however, desired to form the external electrodes 17 by using an electrically conducting composition obtained by dispersing electrically conducting particles in a heat-resistant resin matrix from the standpoint of preventing the breakage in the connection to the internal electrode layers 15 while the actuator is in operation and of enhancing the durability at high temperatures.

In the above electrically conducting composition, an organic resin having a 5%-weight-reduction temperature of not lower than 250° C. is preferably used as a heat-resistant resin for constituting the matrix. That is, by using the above organic resin as a matrix, a sufficiently high degree of durability is maintained even in case the actuator is used in a high-temperature environment like a fuel injection valve for automobiles. When there is used a resin having a 5%-weight-reduction temperature which is not higher than 250° C., the durability may become unsatisfactory at high temperatures.

A 5%-weight-reduction temperature of the resin is, generally, measured by the thermogravimetric analysis (TG). For example, the weight of the sample resin is successively measured while raising the temperature of the sample resin in the open air at a predetermined rate (1 to 10° C./min). The temperature at which the ratio of reduction of the weight is 5% by weight with respect to the initial weight is a 5%-weight-reduction temperature of the sample resin. In the case of the varnish-like resins, the solvent is evaporated and the resin is cured prior to taking a measurement.

The present invention uses the heat-resistant resin having a modulus of elasticity of not larger than 2000 kgf/mm$^2$ and a ductility of not smaller than 10% in order to effectively prevent the breakage in the connection of the internal electrode layers 15 to the external electrodes 17 while the actuator is in operation. When the actuator is in operation, the piezoelectric layers 13 undergo the expansion and contraction, whereby the actuator body 11 expands and contracts in the direction of lamination, and stress occurs. Further, when the actuator is placed in a high-temperature environment, stress generates due to a difference in the coefficient of thermal expansion between the piezoelectric layer 13 and the internal electrode layer 15. The heat-resistant resin having the above modulus of elasticity and ductility, effectively absorbs stress caused by the elongation, contraction and difference in the coefficient of thermal expansion to effectively prevent the breakage in the connection of the internal electrode layers 15 to the external electrodes 17 caused by the stress and, hence, to greatly improve the reliability of the actuator.

As the heat-resistant resin, it is most desired to use a thermosetting resin having an imide bond, such as polyimide, polyamideimide or maleimide resin in order to improve the heat resistance. From the standpoint of effectively absorbing stress stemming from a difference in the coefficient of thermal expansion, further, it is most desired to use a resin, which indicates a thermoplastic property at not lower than 180° C. (a glass transition temperature), among the above thermosetting resin. That is, the actuator forming the external electrodes 17 of the electrically conducting composition using the thermosetting resin as a matrix, most effectively absorbs stress stemming from the difference in the thermal expansion even when it is used as a member for use in an environment where a heat cycle is repeated like a fuel injection valve of automobiles, and reliably prevents the breakage in the connection of the internal electrode layers 15 to the external electrodes 17.

As the electrically conducting particles dispersed in the heat-resistant resin matrix, there can be used the one of at least one kind selected from the group consisting of electrically conducting ceramics, a metal oxide, a metal of the Groups 6 to 11 of periodic table and an alloy thereof.

Concretely speaking, there can be used electrically conducting ceramics comprising chiefly a metal carbide or nitride such as WC or TiN, a metal oxide such as $RuO_2$, a metal having excellent resistance against oxidation, such as Ag, Pd, Ni, Pt or Au, and an alloy thereof or a mixture thereof. In the present invention, in particular, a metal powder of the Groups of 6 to 11 of periodic table having a relatively small volume specific resistivity is preferably used, such as Ni, Ag, Pt or Au. It is desired that these electrically conducting particles have a nonspherical shape such as needle-like shape, flake shape, or a spherical shape. That is, the nonsherical electrically conducting particles more entangle with one another than the spherical electrically conducting particles and, hence, make it possible to greatly increase the shearing strength of the external electrodes 17.

It is desired that the electrically conducting particles are dispersed at a ratio of from 15 to 80% by volume per total amounts of the electrically conducting composition. That is, when the dispersing amount of the electrically conducting particles is smaller than 15% by volume, the frequency of contact of the electrically conducting particles decreases in the matrix and, hence, the electrically conducting composition exhibits an increased resistivity. When a voltage is applied to the external electrodes 7 formed of such an electrically conducting composition, the external electrodes 7 may be locally heated. When the dispersing amount of the electrically conducting particles exceeds 80% by volume, on the other hand, the amount of the matrix resin which is the binder becomes relatively small, and the external electrodes 17 that are formed may lose the strength. Besides, the electrically conducting composition loses paste-like property and makes it difficult to form the external electrodes 17.

In the present invention, the above-mentioned electrically conducting composition has such an advantage that it can be fired at a relatively low temperature as compared with the known material for forming external electrodes, such as an electrically conducting past comprising an electrically conducting material and a glass frit. It is therefore advantageous to form the external electrodes 17 by using the electrically conducting composition even from the standpoint of suppressing the insulating blocks 21 from being degraded by the heat at the time of firing.

In the present invention, the above-mentioned electrically conducting composition is advantageously used for forming the external electrodes 17. It is, however, also allowable to form the external electrodes 17 by using the above electrically conducting composition as an adhesive. That is, a thin plate or a mesh of Ag, Ni, Cu, Al, W, Mo, stainless steel, Fe—Ni—Co alloy or nickel, is stuck to the side surfaces 16*a* and 16*b* for forming the external electrodes by using the above electrically conducting composition as an adhesive, thereby to form the external electrodes 17.

In particular, the external electrodes 17 are formed by burying an electrically conducting mesh in the electrically conducting composition applied onto the side surfaces 16*a* and 16*b* for forming the external electrodes. Then, the external electrodes 17 favorably follow the expansion and contraction of the piezoelectric layers 13 to effectively prevent the breakage of the connection to the external electrodes 17. In this case, it is desired that the pitch of the electrically conducting wires constituting the mesh (gap among the electrically conducting wires) is from 0.5 to 8 times as great as the thickness of the piezoelectric layer 13 to enhance the following performance of the external electrodes 17 without spoiling the strength. To further enhance the following performance, it is desired that the electrically conducting wires have a diameter R which is from 0.05 to 2 times as great as the thickness of the piezoelectric layer 13. It is further desired that the electrically conducting wires are extending at an angle of about 45° with respect to the direction of laminate of the piezoelectric layers 3. It is desired that the electrically conducting wires are formed of a stainless steel of Kovar having excellent antioxidizing property at low temperatures.

Though not shown in FIGS. 1*a* and 1*b*, lead wires are connected to the external electrodes 17. In the present invention, the lead wires are connected using the above-mentioned electrically conducting composition as an adhesive and, hence, the breakage in the lead wires caused by the displacement of the piezoelectric layers 13 is effectively prevented. This is because, the electrically conducting composition excellently follows the displacement of the piezoelectric layers 13. As the electrically conducting composition used for connecting the lead wires, there can be used, as a matrix, a heat-resistant resin having a modulus of elasticity of not larger than 20 GPz and a ductility of not smaller than 10%.

(Another laminated piezoelectric actuator)

Figure 3:
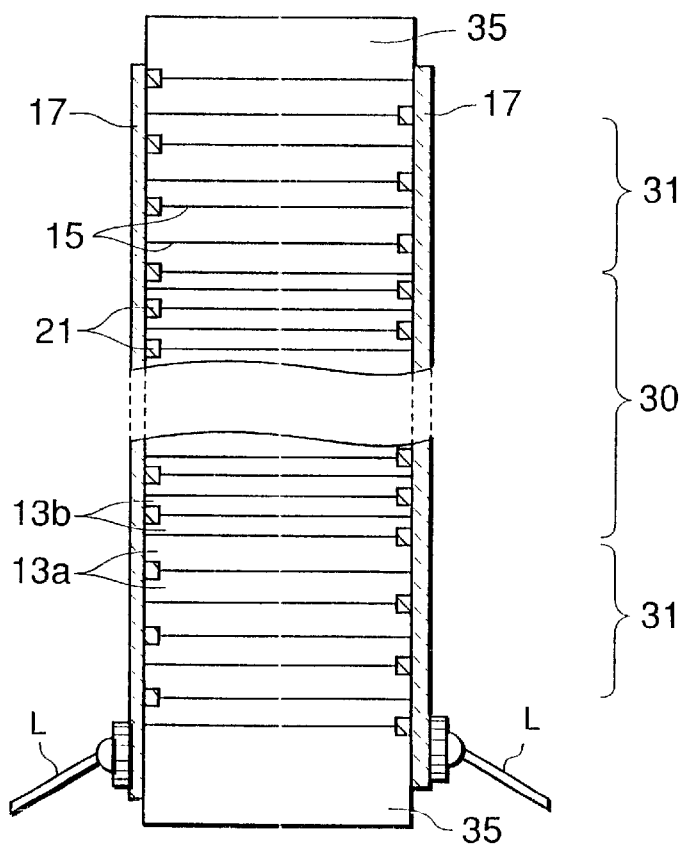
FIG. 3 is a side sectional view illustrating another laminated piezoelectric actuator of the present invention.
Figure 4:
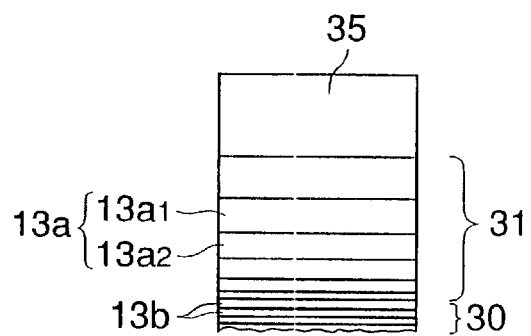
FIG. 4 is a side sectional view illustrating a major portion of a further laminated piezoelectric actuator of the present invention.

In the above-mentioned piezoelectric actuators of the structure shown in FIGS. 1*a* and 1*b*, not-active ceramic layers (not shown) are joined to the upper end and to the lower end, and many piezoelectric layers 13 provided in the actuator body 11 all have substantially the same thickness. With this structure, the actuator body 11 undergoes the expansion and contraction due to the displacement of the piezoelectric layers 13 upon applying a voltage to the internal electrode layers 15, but the non-active ceramic layers do not expand or contract. Accordingly, shearing stress builds up in the boundary portions between the non-active ceramic layers and the actuator body 11, which may decrease the durability of the actuator. In order to suppress the drop in the durability caused by the shearing stress, it is desired that the non-active ceramic layers are provided at the upper end and at the lower end of the actuator body 11 via a stress-relaxing portion. FIGS. 3 and 4 illustrate the laminated piezoelectric actuator provided with the stress-relaxing portions.

The basic structure of the actuator shown in the side sectional view of FIG. 3 is the same as the one shown in FIGS. 1*a* and 1*b*. In the actuator shown in FIG. 3, however, the actuator body 11 is divided into three regions of a central portion 30 and stress-relaxing portions 31, 31 located over and under the central portion 30 in the direction of lamination. The non-active ceramic layers 35 and 35 located at the upper end and at the lower end are joined to the stress-relaxing portions 31 and 31. Further, lead wires L are connected to the external electrodes 17, so that a predetermined voltage can be applied to the internal electrode layers 15 through the external electrodes 17 like in the actuator shown in FIGS. 1*a* and 1*b*.

In an example of FIG. 3, plural piezoelectric layers 13 and plural internal electrode layers 15 are alternatingly laminated in both the central portion 30 and the stress-relaxing portions 31 (piezoelectric layers in the stress-relaxing portions 31 are denoted by 13*a*, and the piezoelectric layers in the central potion 30 are denoted by 13*b*), and the insulating blocks 21 are alternatingly arranged at the ends of the internal electrode layers 15 in the same manner as in FIGS. 1*a* and 1*b*. In the stress-relaxing portions 31, the plural piezoelectric layers 13*a* have the same thickness. The plural piezoelectric layers 13*b* in the central portion 30, too, have the same thickness. However, the thickness of the piezoelectric layers 13*a* in the stress-relaxing portions 31 is larger than the thickness of the piezoelectric layers 13*b* in the central portion 30. In general, it is desired that the thickness of the piezoelectric layers 13a is 1.3 to 2.5 times and, particularly, 1.5 to 2.30 times as large as the thickness of the piezoelectric layers 13b. By selecting the thickness of the piezoelectric layers 13a to be larger than the thickness of the piezoelectric layers 13b, the amount of displacement of the piezoelectric layers 13a per unit length becomes smaller than that of the piezoelectric layers 13b. Therefore, the shearing stress building up in the boundary portion between the actuator body 11 and the ceramic layer 35 due to the piezoelectric transverse distortion, is suppressed by the stress-relaxing portions 31 having the piezoelectric layers 13a.

In the actuator of FIG. 3, the plural piezoelectric layers 13a have the same thickness in the stress-relaxing portions 31. Therefore, the actuator employs the piezoelectric layers of only two kinds (piezoelectric layers 13a and 13b) offering an advantage of easy production.

Further, the thicknesses of the plural piezoelectric layers 13a formed in the stress-relaxing portions 31 may be gradually increased from the central portion 30 toward the ceramic layers 35 provided at the upper end and at the lower end. This is shown in a side sectional view of FIG. 4 which illustrates a major portion.

In the stress-relaxing portion 31 shown in FIG. 4, if attention is given to the two neighboring piezoelectric layers $13a_1$ and $13a_1$, the piezoelectric layer $13a_1$ on the side of the ceramic layer 35 has a thickness larger than that of the piezoelectric layer $13a_2$ on the side of the central portion 30. Upon gradually increasing the thickness of the piezoelectric layers 13a located on the side of the ceramic layers 35, the shearing stress building up in the boundary portion between the ceramic layers 35 and the actuator body 11 can be effectively relaxed. In the example of FIG. 4, it is desired that the thickness of the piezoelectric layer $13a_1$ on the side of the ceramic layer is 1.05 to 1.18 times and, particularly, 1.07 to 1.12 times as large as the thickness of the piezoelectric layer $13a_2$ on the side of the central portion 30 or is larger by 0.005 to 0.020 mm and, particularly, larger by 0.008 to 0.014 mm than the thickness of the piezoelectric layer $13a_2$ on the side of the central portion 30, though it may vary depending upon the thickness of the piezoelectric layers 13b in the central portion 30. In this example of FIG. 4, the shearing stress is effectively suppressed even in the boundary regions between the stress-relaxing portions 31 and the central portion 30.

In the actuator of the structure shown in FIGS. 3 and 4, the central portion 30 includes a suitable number of piezoelectric layers 13b (usually, 100 layers to 400 layers) depending upon the use. In order to obtain the effect which sufficiently suppresses the shearing stress, however, it is desired that the stress-relaxing portion 31 includes the piezoelectric layers 13a in a number of from 6 to 24 layers. When the number of the layers is smaller than this range, the effect is not sufficiently obtained for suppressing the shearing stress. When the number of the layers is larger than this range, on the other hand, the actuator body 11 becomes too bulky.

(Fabrication of the laminated actuator)

The laminated piezoelectric actuator of the present invention having the above-mentioned structure can be fabricated by a method described below.

First, a slurry is prepared by mixing a calcined powder of piezoelectric ceramics such as PZT, a predetermined binder and a plasticizer, and a ceramic green sheet having a thickness of 70 to 300 $\mu$m (sheet for piezoelectric layer) is formed by the doctor blade method.

An electrically conducting paste comprising chiefly a conductor (e.g., silver) for forming the internal electrode layer is applied onto one surface of the green sheet by the screen-printing method maintaining a thickness of about 1 to 10 $\mu$m. Then, a predetermined number of pieces of the green sheets are laminated in a metal mold, and are laminated as a unitary structure by being heated at about 50 to 200° C. and by being pressurized.

The obtained laminate is cut into a predetermined size, heated at 300 to 800° C. for 10 to 80 hours to remove the binder, and is fired at 900 to 1200° C. for 2 to 5 hours to obtain a square cylindrical laminated sintered product that serves as an actuator body 11. The ends of the internal electrode layers 15 are exposed to the four side surfaces of the laminated sintered product.

According to the above-mentioned method, the plural piezoelectric layers 13 and the plural internal electrode layers 15 are simultaneously formed by firing. It is, however, also allowable to fabricate the laminate that serves as the actuator body by preparing may pieces of piezoelectric plates by firing the piezoelectric material, and laminating the piezoelectric plates as a unitary structure via electrode plates and an electrode paste. When the piezoelectric layer 13 has a thickness $t_2$ which is as very thin as about 100 $\mu$m, however, the simultaneous firing method can be favorably employed.

Thereafter, the outer periphery of the laminated sintered product is machined, and the two side corners located on a diagonal line are chamfered to obtain a hexagonal cylindrical shape. The side surfaces 16a and 16b for forming the external electrodes are formed by chamfering. Referring to FIG. 1, it is desired that the chamfering length C is very smaller than the length W of a side of the square cylindrical actuator body but is large enough for forming the external electrodes 7 without interruption as will be described later. Upon forming the side surfaces 16a and 16b for forming the external electrodes by chamfering, it is allowed to easily adjust the areas of the side surfaces for forming the external electrodes depending upon the areas of the external electrodes. For example, the areas of the side surfaces 16a and 16b for forming the external electrodes can be decreased as much as possible depending upon the areas of the external electrodes to easily form the side surfaces for forming the external electrodes having areas very smaller than those of other side surfaces, making it possible to decrease the machining cost, to decrease the concentration of stress that generates near the ends of the internal electrode layers, and to further lengthen the life.

In the above-mentioned example, the actuator body 11 has a hexagonal cylindrical shape formed by chamfering the side corners of the square cylindrical laminate in the direction of lamination. Not being limited thereto only, however, the actuator body 11 may be of a cylindrical shape or may be of a polygonal cylindrical shape other than the hexagonal cylinder. When the number of faces of the cylindrical shape becomes more, the area of the cross sectional of the actuator body 11 becomes large and therefore, the force that generates in the actuator body 11 becomes large. Though it is desired that the side surfaces 16a and 16b for forming the external electrodes are opposed to each other, they need not necessarily be formed at opposing positions.

In the present invention, further, it is desired that the side surfaces 16a and 16b for forming the external electrodes are coarsely machined, and the surface coarseness Ra (JIS B0601) of the piezoelectric layers 13 exposed to the side surfaces is adjusted to lie within a range of from 5 to 10 μm. The coarse-surface machining makes it possible to increase the adhering force between the ends of the piezoelectric layers 13 and the external electrodes 17 made of the above-mentioned electrically conducting composition or the electrically conducting composition used as an adhesive for sticking the external electrodes 17, and, hence, to effectively prevent the breakage of connection to the external electrodes or the peeling of the piezoelectric layers 13 from the internal electrode layers 15 caused by the displacement of the piezoelectric layers 13.

Recessed portions of a shape that satisfies the conditions of the above-mentioned formula (1) are formed in the thus formed side surfaces 16a and 16b for forming the external electrodes. That is, the recessed portions are for forming the insulating blocks 21. Referring to FIG. 1b, the recessed portions have a size that include the upper and lower piezoelectric layers 13 with the ends of the internal electrode layers as centers. The recessed portions formed in the side surfaces 16a and 16b are formed in every other layers in a zig-zag manner. The recessed portions are easily machined by cutting by using a diamond circular grindstone or a laser beam. In this case, if the dispersion in the thicknesses of the plural piezoelectric layers 13 and of the plural internal electrode layers 15 is suppressed, many recessed portions can be machined simultaneously by setting many diamond grindstones maintaining a predetermined gap in advance. Further, the recessed portions must satisfy the conditions of the above-mentioned formula (1). When the diamond circular grindstones are used, therefore, the condition of the grindstones must be adjusted.

The thus formed recessed portions are filled with an insulating elastic material such as silicone rubber to form insulating blocks 2. The insulating blocks have a shape satisfying the conditions of the formula (1).

The above-mentioned electrically conducting composition for forming the external electrodes is applied onto the side surfaces 16a and 16b for forming the external electrodes of the actuator body 11 formed as described above and, as required, is fired to form the external electrodes 17.

The following procedure is complied with when the external electrodes 17 are to be formed by using the electrically conducting composition using, as a resin matrix, a heat-resistant resin which is sparingly soluble in a solvent, such as a polyimide which does not dissolve in a solvent except concentrated sulfuric acid.

That is, a polyamic acid which is a precursor of the polyimide is dissolved in a solvent such as N-methyl-2-pyrrolidone (NMP) or tetrahydrofuran (THF) to obtain a varnish-like mixture. The varnish is kneaded together with an electrically conducting agent at a predetermined volume percentage using a kneader such as a three-roll mill to prepare an electrically conducting paste. The electrically conducting paste is applied onto the side surfaces 16a and 16b for forming the external electrodes, and is heated in the air or in a nitrogen atmosphere at room temperature to 400° C. to vaporize the solvent and to cure the paste. Thus, there are formed the external electrodes 17 having excellent heat resistance and heat cycle resistance.

As described earlier, the external electrodes 17 can be formed even by sticking the electrically conducting members in the form of a thin plate or a mesh onto the side surfaces 16a and 16b for forming the external electrodes by using the above-mentioned electrically conducting composition.

A predetermined voltage is applied to the external electrodes 17 formed as described above to polarize the piezoelectric layers 13, thereby to obtain the laminated piezoelectric actuator of the present invention.

EXPERIMENTAL EXAMPLES

Experimental Example 1

Figure 5:
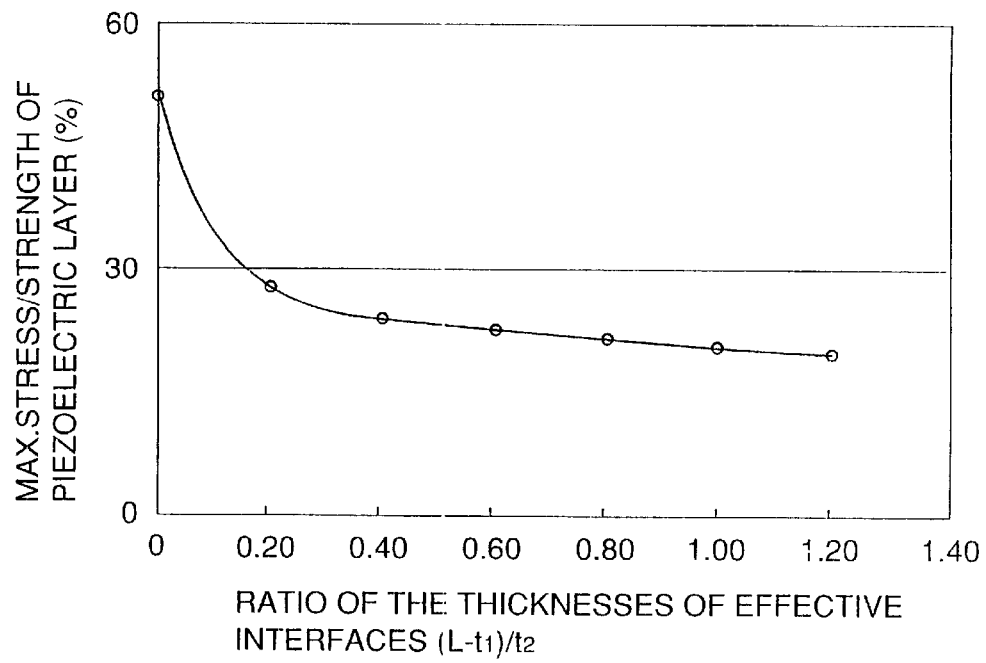
FIG. 5 is a graph illustrating a relationship between the ratio of the thicknesses of effective interfaces on the side surface of the insulator block and the strength of the piezoelectric layer.

FIG. 5 shows the results of analysis, by the finite element method, of a relationship between the ratio of the thicknesses of the effective interfaces $(L-t_1)/t_2$ and the ratio of the maximum main stress that generates when an oscillation of 60 Hz is applied to the piezoelectric layers to the static strength of the piezoelectric layers by using the actuator body of the structure shown in FIGS. 1a and 1b that includes the piezoelectric layers (PZT) of a thickness ($t_2$) of 100 μm, internal electrode layers (Ag) of a thickness ($t_1$) of 3 μm and insulating blocks made of a silicone rubber (L is a length of the flat surface on the side surface of the insulating block).

It will be understood from FIG. 5 that the maximum main stress sharply increases when the ratio of the thicknesses of the effective interfaces is smaller than 0.2 but mildly decreases in a range where the above ratio is not smaller than 0.2. Besides, the ratio of the maximum main stress value to the strength of the piezoelectric layer is not larger than 30%, which is suited for lengthening the life against the fatigue of the actuator that is repetitively driven. In particular, when the ratio of the thicknesses of effective interfaces is not smaller than 0.40, the ratio of the maximum main stress to the strength of the piezoelectric layer becomes not larger than 25% making it possible to further enhance the life against the fatigue. Further, as the ratio of the thicknesses of the effective interfaces becomes not smaller than 0.6, the ratio of the maximum main stress to the strength of the piezoelectric layer can be maintained to be smaller than 25% despite the thickness of the piezoelectric layers 13 is changed by 0.1 $t_2$ (or, in other words, despite the junction portions between the insulating blocks 21 and the internal electrode layers 15 are deviated by 0.1 $t_2$). Therefore, the ratio of the thicknesses of the effective interfaces which is not smaller than 0.6 helps increase the permissible range of machining precision, which is desirable from the standpoint of productivity.

Further, when the ratio of the thicknesses of the effective interfaces is smaller than 0.9, a curved portion having a radius R of curvature of not smaller than 0.05 $t_2$ can be provided in the corner portion of the insulating block 21 (corner portion of the recessed portion for forming the insulating block 21) in order to relax the concentration of stress by the corner portion.

Experimental Example 2

Figure 6:
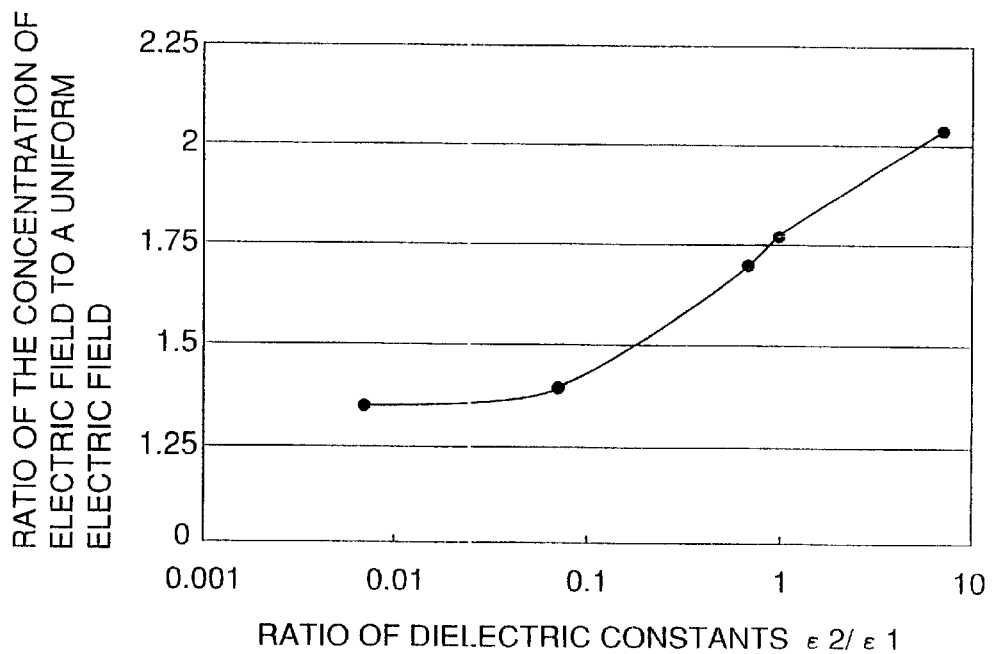
FIG. 6 is a graph illustrating a relationship between the ratio of dielectric constants ($\epsilon_2/\epsilon_1$) and the ratio $E/E_0$ (ratio of electric field concentrations) of an electric field value E concentrated in the piezoelectric layer near the end of the internal electrode to a uniform electric field value $E_0$ generated in the central portion in the piezoelectric layer.

FIG. 6 shows the results of analysis of a relationship between the ratio $E/E_0$ (ratio of the concentrations of electric fields) of the electric field value $E$ to the electric field value $E_0$ and the ratio ($\in_2/\in_1$) of the dielectric constant $\in_2$ of the insulating block 21 to the dielectric constant $\in_1$ in the polarizing direction of the piezoelectric layer 13 under the same conditions as in Experimental Example 1 when a large electric field value generated in the piezoelectric layer 13 near the end of the insulating block of the internal electrode layer 15 is denoted by $E$ and the uniform electric field value generated in the piezoelectric layer 13 sufficiently separated away from the side surface of the actuator body 11 is denoted by $E_0$.

From FIG. 6, the concentration of electric field at the end of the internal electrode layer 15 sharply rises with the ratio of dielectric constants ($\in_2/\in_1$)=0.1 as a boundary, from which it will be learned that it is better to suppress the ratio of dielectric constants ($\in_2/\in_1$) to be smaller than 0.1 for suppressing the concentration of the electric field.

Experimental Example 3

Figure 7:
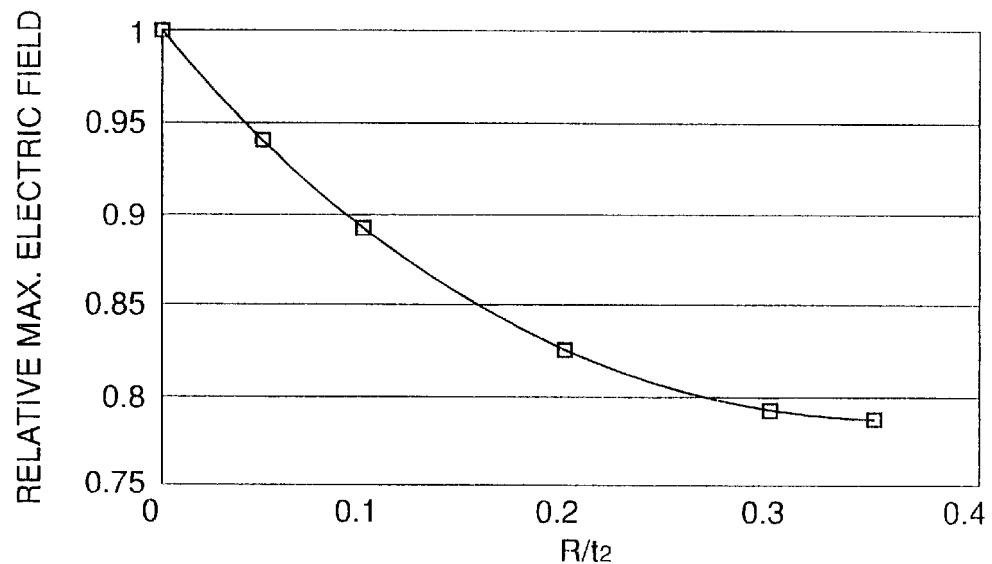
FIG. 7 is a graph illustrating a relationship between the ratio $R/t_2$ of the radius R of curvature of a side corner portion of the insulating block 21 to the thickness $t_2$ of the piezoelectric layer 13 and the ratio (relative maximum electric field) to a maximum electric field value of when a maximum electric field value R generated in the piezoelectric layer 13 is 0.

FIG. 7 is a graph wherein the abscissa represents the ratio $R/t_2$ of the radius $R$ of curvature of a side corner portion of the insulating block 21 to the thickness $t_2$ of the piezoelectric layer 13, and the ordinate represents the ratio (relative maximum electric field) to a maximum electric field value of when a maximum electric field value $R$ generated in the piezoelectric layer 13 is 0.

From FIG. 7, the maximum electric field value decreases with an increase in $R$, and when $R$ is not smaller than 5% of the thickness $t_2$ of the piezoelectric layer, the maximum electric field value that generates in the piezoelectric layer 13 drops to not larger than 95% of the value of when $R$=0.

On the other hand, when $R$ becomes not smaller than 0.3 $t_2$, the rate of drop in the maximum electric field value becomes very small. When $R$ becomes not smaller than 0.3 $t_2$, further, it becomes difficult to select the length $L$ of the flat surface 23 on the side surface of the insulating block 21 to be a sufficiently large value.

In the present invention, therefore, it is desired that $0.05 t_2 \leq R \leq 0.3 t_2$.

Further, when $R \geq 0.1 t_2$, the maximum electric field value becomes smaller than 90% that of when $R$=0. When $R \leq 0.2t_2$, it becomes difficult to select the difference ($L-t_1$) between the length $L$ of the flat surface 23 of the insulating block 21 and the thickness $t_1$ of the internal electrode layer 15 to be not smaller than 60% of $t_2$. According to the present invention, therefore, it is particularly desired that $0.1 t_2 \leq R \leq 0.2t_2$.

Experimental Example 4

Figure 8:
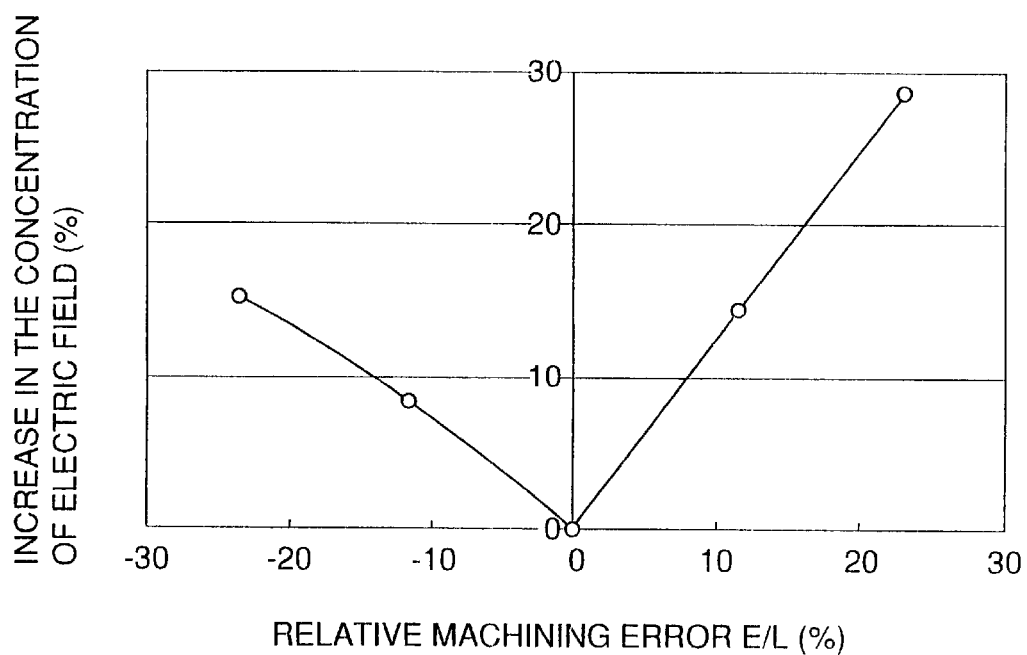
FIG. 8 is a graph illustrating a relationship between the deviation (relative machining error E/L) from an ideal flat surface 23 (designed value) in the shape of side surface of the insulating block 21 that is really obtained and the increase in the electric field concentration (increase beyond the electric field concentration of when E=0)

FIG. 8 illustrates the results of analyzing a relationship between the deviation (error) of the side surface of the insulating block 21 that is really obtained relative to the ideal flat surface 23 of the insulating block 21 and the increase in the concentration of the electric field (increase relative to the concentration of the electric field of when E=0) with respect to the relative machining error E/L (L=length of the ideal flat surface 23) under the same conditions as in Experimental Example 1. In analyzing the results, the error E is presumed to possess a positive sign when the insulating block 21 is formed to be larger than an ideal value (design value), i.e., when the recessed portion for forming the insulating block 21 is formed deeper than the designed value.

From the results of analysis shown in FIG. 8, when the relative machining error E/L is within ±17%, an increase in the concentration of the electric field is not larger than 20% as compared to when the insulating block 21 has an ideal flat surface 23. Further, when the relative machining error E/L is within ±8%, an increase in the concentration of the electric field is not larger than 10%. In the present invention, therefore, it can be so regarded that an ideal flat surface 23 has been formed on the side surface of the insulating block 21 provided the relative machining error E/L is within ±17% and, particularly, within ±8%.

From the results of the laminated piezoelectric actuator of Experimental Examples 1 to 4 of the present invention, it will be understood that upon optimizing the shape and size of the side surfaces of the insulating blocks 21, and the ratio of dielectric constants of the insulating blocks 21 and the piezoelectric layers 13, it is allowed to decrease the concentration of electric field and the concentration of stress that build up in the piezoelectric layers, to suppress the maximum main stress value to be not larger than 30% with respect to the static strength of the piezoelectric material, and to suppress the breakdown caused by the mechanical fatigue.

Experimental Example 5

Electrically conducting compositions were prepared by using a polyimide resin having a 5%-weight-reduction temperature of 300° C. as a matrix and using a silver powder as an electrically conducting agent, while varying the content of the silver powder, and were measured for their resistivity and adhesion strength. As for the adhesion strength, the electrically conducting composition was adhered onto a piezoelectric plate of PZT, pulled in a direction perpendicular to the direction of adhesion to take a measurement using an autograph (made by Simazu Seisakusho Ltd.). The results were as shown in Table 1.

TABLE 1

| Silver content (% by vol.) | Resistivity (Ωmm) | Adhesion strength (kgf/mm$^2$) | Evaluation |
|---|---|---|---|
| 10 | $6 \times 10^1$ | $8 \times 10^0$ | X |
| 15 | $3 \times 10^{-2}$ | $7 \times 10^0$ | ◯ |
| 20 | $7 \times 10^{-4}$ | $6 \times 10^0$ | ◯ |
| 50 | $5 \times 10^{-4}$ | $6 \times 10^0$ | ◯ |
| 70 | $8 \times 10^{-4}$ | $2 \times 10^0$ | ◯ |
| 80 | $6 \times 10^{-3}$ | $1 \times 10^0$ | ◯ |
| 90 | $4 \times 10^0$ | $1 \times 10^{-1}$ | X |

◯: Suited as ext. electrode.
X: Not suited as ext. electrode.

The results were as shown in Table 1. When the content of the electrically conducting agent is smaller than 15% by volume, the electrically conducting composition exhibits too large resistivity and is not utilizable as an external electrode. When the content of the electrically conducting agent is not smaller than 80% by volume, on the other hand, the resin component which is a matrix component becomes relatively small and the adhesive strength to the PZT piezoelectric plate becomes small. When the content of the electrically conducting agent is selected to lie in a range of 15 to 80% by volume, on the other hand, the electrically conducting composition can be used as an external electrode without problem in both resistivity and adhesion strength.

The resistivities were also measured by using materials shown in Table 2 as electrically conducting agents in addition to the silver powder in an amount of 40% by volume. When these electrically conducting agents are used in amounts of from 15 to 80% by volume in the same manner as described above, the electrically conducting compositions can be used as the external electrodes exhibiting excellent electrically conducting property and adhesiveness.

TABLE 2

| Electrically conducting agent | Resistivity (Ωmm) | Evaluation |
| --- | --- | --- |
| Ti nitride | $8 \times 10^{-2}$ | ○ |
| Rh oxide | $9 \times 10^{-1}$ | ○ |
| Palladium | $7 \times 10^{-4}$ | ○ |
| Nickel | $2 \times 10^{-2}$ | ○ |
| Gold | $2 \times 10^{-4}$ | ○ |

Next, electrically conducting compositions were prepared by using several kinds of resins having different 5%-weight-reduction temperatures as matrixes and were measured for their adhesion strength to the PZT piezoelectric material after left to stand at 200° C. for predetermined periods of time. As the electrically conducting agent, the silver powder was contained in an amount of 40% by volume.

TABLE 3

| | 5%-wt.-reduction temp. (° C.) | Adhesion strength after left in 200° C. atmosphere (kgf/mm²) | | | Evaluation |
| --- | --- | --- | --- | --- | --- |
| | | Initial | After 100 hr | After 300 hr | |
| Resin A | 150 | 8 | 0.1 | split | X |
| Resin B | 200 | 8 | 2 | 1 | X |
| Resin C | 250 | 7 | 6 | 6 | ○ |
| Resin D | 270 | 9 | 9 | 8.5 | ○ |
| Resin E | 300 | 7 | 7 | 7 | ○ |

As shown in Table 3, when the 5%-weight-reduction temperature is not higher than 250° C., a sufficient degree of strength is not maintained when used in a high-temperature environment. When the matrix is formed by using a resin having a 5%-weight-reduction temperature of not lower than 250° C., on the other hand, a sufficient degree of strength is maintained even when used in a high-temperature environment.

Experimental Example 6

The laminated piezoelectric actuator shown in FIGS. 1a and 1b was prepared by forming the external electrodes 17 by using an electrically conducting composition using, as a matrix, a polyimide resin having a 5%-weight-reduction temperature of 300° C. and a silver powder as an electrically conducting agent in an amount of 40% by volume. PZT having a thickness of 100 μm was used as the piezoelectric layer 13, and silver-palladium having a thickness of 3 μm was used as the internal electrode layer 15, the number of laminates being 300. Among the internal electrode layers 15 and the external electrodes 17, silicone rubbers were arranged as insulating blocks 21 after every other layers.

When a DC voltage of 200 V was applied to the thus obtained laminated piezoelectric actuators, a displacement of 50 μm was obtained. Further, an AC electric field of 0 to +200 V, 50 Hz, was applied to the actuator to conduct the drive testing. As a result, a displacement of 50 μm could be maintained up to $5 \times 10^8$ cycles. Even when an AC voltage of 200 V, 50 Hz, was applied to the laminated piezoelectric actuator of the present invention in an atmosphere of 200° C. up to $5 \times 10^8$ cycles, discharge or breakage did not quite occur, and the displacement equal to the initial displacement was maintained.

Experimental Example 7

Laminated piezoelectric actuators of the same constitution as those of Example 6 were fabricated by forming the external electrodes 17 by using the electrically conducting compositions prepared by using, as a matrix, several kinds of resins having different 5%-weight-reduction temperatures and a silver powder as an electrically conducting agent, while varying the content of the silver powder. The thus obtained laminated piezoelectric actuators were tested by applying an AC voltage of 200 V, 50 Hz, in an atmosphere of 200° C. The results were as shown in Table 4.

TABLE 4

| Sample No. | 5%-wt.-reduction temperature (° C.) of matrix resin | Content of conducting agent (% by vol.) | Results | Evaluation |
| --- | --- | --- | --- | --- |
| 1 | 200 | 40 | after $1 \times 10^5$ cycles, the amount of displacement decreased to one-half the initial amount. | X |
| 2 | 300 | 10 | after $2 \times 10^2$ cycles, the external electrodes were locally heated. | X |
| 3 | 300 | 90 | | X |
| 4 | 250 | 15 | normal even after $5 \times 10^8$ cycles. | ○ |
| 5 | 250 | 80 | normal even after $5 \times 10^8$ cycles. | ○ |
| 6 | 300 | 40 | normal even after $5 \times 10^8$ cycles. | ○ |

In the case of the actuator of the sample No. 1, the amount of displacement after $1 \times 10^5$ cycles was only about one-half the initial amount. This is because, the matrix resin in the electrically conducting composition forming the external electrodes 17 has a 5%-weight-reduction temperature of not higher than 250° C., and is not capable of maintaining the adhesion strength in a high-temperature atmosphere causing some internal electrode layers 15 to be peeled off and blocking the supply of voltage to some piezoelectric layers 13.

In the case of the actuator of the sample No. 2, the external electrodes 17 were locally heated after $2 \times 10^2$ cycles. This is because, since the content of the electrically conducting conducting composition prepared by using, as a matrix, resins having a 5%-weight-reduction temperature of not lower than 250° C. but having different moduli of elasticity and ductilities. As the electrically conducting agent, a silver powder was used in an amount of 40% by volume. The thus obtained laminated piezoelectric actuators were tested by varying the intensity of the AC electric field to be 200 V, 250 V and 3000 V at a frequency of 50 Hz.

The results were as shown in Table 5.

TABLE 5

| Sample No. | Modulus of elasticity of matrix resin (kgf/mm²) | Ductility of matrix resin | Applied electric field: 0-E (V) | | |
|---|---|---|---|---|---|
| | | | E = 200 | E = 250 | E = 300 |
| 7 | 2500 | 2 | normal even after $2 \times 10^5$ cycles | connection to external electrodes broken after $3 \times 10^4$ cycles | external electrodes split off after $2 \times 10^3$ cycles |
| 8 | 2500 | 10 | normal even after $2 \times 10^5$ cycles | connection to external electrodes broken after $8 \times 10^4$ cycles | external electrodes split off after $1 \times 10^4$ cycles |
| 9 | 2000 | 2 | normal even after $2 \times 10^5$ cycles | normal even after $2 \times 10^5$ cycles | connection to external electrodes broken after $1 \times 10^5$ cycles |
| 10 | 2000 | 10 | normal even after $2 \times 10^5$ cycles | normal even after $2 \times 10^5$ cycles | normal even after $2 \times 10^5$ cycles |
| 11 | 1000 | 30 | normal even after $2 \times 10^5$ cycles | normal even after $2 \times 10^5$ cycles | normal even after $2 \times 10^5$ cycles | agent is smaller than 15% by weight in the composition that is forming the external electrodes 17, contact is not accomplished among the electrically conducting particles in the electrically conducting composition. As a result the electrically conducting composition exhibits an increased resistivity and locally generates the heat.

In the case of the actuator of the sample No. 3, it was confirmed that the external electrodes 17 have split off after $5 \times 10^4$ cycles. This is because, the amount of the electrically conducting material contained in the electrically conducting composition forming the external electrodes 17 is not smaller than 80% by volume and, hence, the amount of the matrix component that takes part in the adhesion is not sufficient. As a result, the external electrodes 17 split off the actuator body during the operation.

In the case of the samples Nos. 4, 5 and 6, on the other hand, the 5%-weight-reduction temperature of the matrix resin in the electrically conducting composition forming the external electrodes 17 is not lower than 250° C. and the content of the electrically conducting agent is from 15 to 80% by volume. Even when continuously operated at high speeds in a high-temperature environment while being applied with a high electric field, therefore, a high degree of durability is obtained without interrupting the electric connection between the external electrodes 17 and the internal electrode layers 15 and without causing the external electrodes 17 to be locally heated.

Example 8

Laminated piezoelectric actuators of the same constitution as that of Experimental Example 6 were fabricated by forming the external electrodes 17 using the electrically In the case of the actuators of the samples Nos. 7, 8 and 9, the resins which are matrix components in the electrically conducting compositions forming the external electrodes 17 have moduli of elasticity of not smaller than 2000 kgf/mm² or ductilities of smaller than 10%. Therefore, there is no problem when the actuators are driven at 200 V. As the driving electric field is increased, i.e., as the amount of displacement of the actuator body increases, however, the electrically conducting composition (external electrodes 17) no longer follows the expansion and contraction of the actuator body, whereby the external electrodes 17 are cracked during the operation and the connection to the external electrodes 17 is broken.

In the samples Nos. 10 and 11, on the other hand, the matrix resins in the electrically conducting compositions forming the external electrodes 17 have moduli of elasticity of not larger than 2000 kgf/mm² and ductilities of not smaller than 10%. Even when the driving electric field is increased, i.e., even when the amount of displacement of the actuator body is increased, therefore, the external electrodes 17 sufficiently follow the expansion and contraction of the actuator body, and the external electrodes 17 do not split off during the operation or the connection thereto is not broken.

Experimental Example 9

Laminated piezoelectric actuators were fabricated having the same constitution as that of Experimental Example 6 but changing the kind of the matrix resin in the electrically conducting composition forming the external electrodes 17. As the electrically conducting agent, there was used a silver powder in an amount of 40% by volume. The resins that were used all exhibited 5%-weight-reduction temperatures of not lower than 250° C. The obtained laminated piezoelectric actuators were tested in an atmosphere of temperatures of 200° C., 250° C. and 300° C. by applying an AC voltage of 200 V, 50 Hz.

The results were as shown in Table 6.

TABLE 6

| Sample No. | Kind of matrix resin | Atmospheric temperature | | |
|---|---|---|---|---|
| | | 200° C. | 250° C. | 300° C. |
| 12 | polyimide | normal even after 2 × 10$^5$ cycles | normal even after 2 × 10$^5$ cycles | normal even after 2 × 10$^5$ cycles |
| 13 | polyamideimide | normal even after 2 × 10$^5$ cycles | normal even after 2 × 10$^5$ cycles | connection to external electrodes broken after 1 × 10$^5$ cycles |
| 14 | silicone | normal even after 2 × 10$^5$ cycles | connection to external electrodes broken after 4 × 10$^4$ cycles | connection to external electrodes broken after 2 × 10$^3$ cycles |
| 15 | epoxy | normal even after 2 × 10$^5$ cycles | connection to external electrodes broken after 6 × 10$^4$ cycles | connection to external electrodes broken after 3 × 10$^3$ cycles |
| 16 | bismaleimide | normal even after 2 × 10$^5$ cycles | normal even after 2 × 10$^5$ cycles | connection to external electrodes broken after 2 × 10$^5$ cycles |

As shown in FIG. 6, in the actuators using silicone and epoxy as matrixes as in the samples Nos. 14 and 15, the connection to the external electrodes 17 was broken in the heat cycle testing at not lower than 250° C. In the samples Nos. 12, 13 and 16 using resins having an imide bond such as polyimide, polyamideimide and maleimide, which have particularly excellent heat resistance among the organic resins, on the other hand, the laminated piezoelectric actuators could be fabricated having excellent heat resistance.

Experimental Example 10

Laminated piezoelectric actuators having the same constitution as that of Experimental Example 6 were fabricated by forming the external electrodes 7 by using several kinds of electrically conducting compositions prepared by using thermoplastic resins having different glass transition temperatures as matrixes. The resins all possessed 5%-weight-reduction temperatures of not lower than 250° C., and a silver powder was used as the electrically conducting agent in an amount of 40% by volume. The obtained laminated piezoelectric actuators were subjected to the following heat cycles and drive testing.

Procedure 1: Driven at 25° C. by applying an AC voltage of 200 V, 50 Hz, up to 1×10$^3$ cycles.
Procedure 2: Brought to the atmosphere of 160° C. in five seconds.
Procedure 3: Driven at 160° C. by applying an AC voltage of 200 V, 50 Hz, up to 1×10$^3$ cycles.
Procedure 4: Brought to the atmosphere of 25° C. in five seconds.

Hereinafter, the procedure 1→procedure 2→procedure 3→procedure 4→procedure 1→ . . . were repeated.

The results were as shown in Table 7.

TABLE 7

| Sample No. | Kind of matrix resin | Glass transition temp. (° C.) | Results of testing | Evaluation |
|---|---|---|---|---|
| 17 | thermoplastic | 150 | amount of displacement is 2/3 of the initial amount after 200 heat cycles | X |
| 18 | thermoplastic | 180 | normal even after 5000 heat cycles | ○ |
| 19 | thermoplastic | 200 | normal even after 5000 heat cycles | ○ |

In the case of the sample No. 17, the thermoplastic resin having a glass transition temperature of 150° C. is used as a matrix. When the temperature is quickly brought from the atmosphere of 25° C. to the atmosphere of 160° C., therefore, the temperature of the atmosphere exceeds the glass transition temperature of the matrix and, hence, the adhesion strength of the electrically conducting composition decreases, the interface peels between some internal electrode layers 15 and the external electrodes 17 due to stress produced by a difference in the thermal expansion, the voltage is not applied to some piezoelectric layers 13, and the amount of displacement decreases.

In the samples Nos. 18 and 19, on the other hand, the thermoplastic resins having glass transition temperatures of not lower than 180° C. are used as matrixes. Therefore, the thermal stress produced by the heat cycle is sufficiently absorbed by the electrically conducting composition (external electrodes 17). Besides, since the glass transition point is sufficiently high, adhesion strength is maintained even at high temperatures. That is, since the thermoplastic resins having glass transition temperatures of not lower than 180° C. are used as matrixes of the electrically conducting compositions, there are provided laminated piezoelectric actuators exhibiting durability even at high temperatures and under heat cycle conditions.

Experimental Example 11

A laminated piezoelectric actuator was fabricated (sample No. 20) by forming the external electrodes 17 by using an electrically conducting composition using, as a matrix, a polyimide resin having a 5%-weight-reduction temperature of 300° C. and a silver powder in an amount of 40% by weight as an electrically conducting agent. Further, a laminated piezoelectric actuator was fabricated (sample No. 21) by forming the external electrodes 17 by sticking electrically conducting members of thin plates of Kovar (made by SumitomoKinzoku Ltd.) having a thickness of 0.1 mm by using the above electrically conducting composition. Both of these actuators employed PZT of a thickness of 100 μm as the piezoelectric members 13 and silver-palladium of a thickness of 3 μm as the internal electrode layers 15, the number of the laminated layers being 300. Further, the silicone rubber was used as insulating blocks 21. The obtained laminated piezoelectric actuators were tested in an environment of 200° C. by applying an AC voltage of 250 V, 60 Hz.

The results were as shown in Table 8.

TABLE 8

| Sample No. | Constitution of external electrodes | Results of testing |
| --- | --- | --- |
| 20 | formed by an electrically conducting composition | amount of displacement has decreased to 5/6 after $1 \times 10^9$ cycles |
| 21 | electrically conducting thin plate is connected using the electrically conducting composition | normal even after $1 \times 10^9$ cycles |

The laminated piezoelectric actuator of sample No. 21 exhibits a higher durability than the laminated piezoelectric actuator of No. 20 when it is continuously operated at high speeds in a high-temperature atmosphere. That is, when the actuator is continuously operated at high speeds under severe environment, cracks that may develop in the electrically conducting composition due to the expansion and contraction of the actuator body do not spread into the electrically conducting member forming the external electrodes 17. Upon sticking the external electrodes 17 by using the electrically conducting composition, therefore, it is made possible to provide an actuator having a higher reliability than that of the actuator having the external electrodes 17 formed of the electrically conducting composition.

Experimental Example 12

Figure 9:
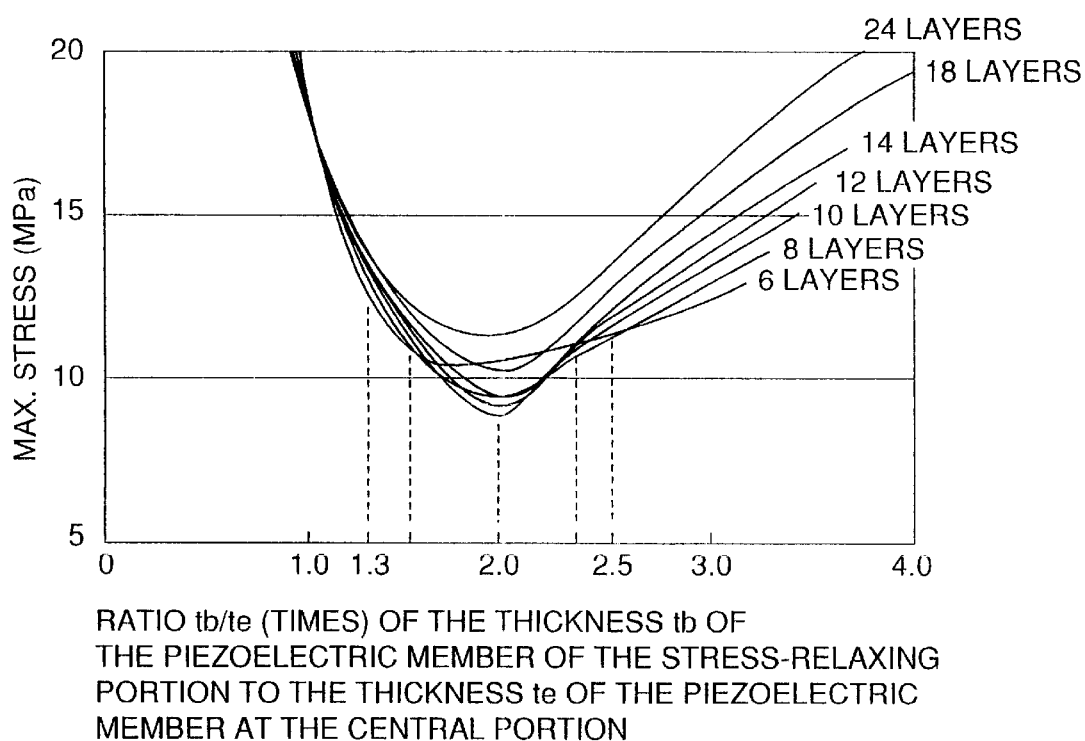
FIG. 9 is a graph illustrating a relationship between the ratio (tb/te) of the thickness tb of the piezoelectric layer in the stress-relaxing portion to the thickness te of the piezoelectric layer in the central portion of the actuator body and a maximum stress building up in the boundary portion between the inert ceramic layer and the actuator body.

FIG. 9 shows the results of analysis of the relationship between the ratio (tb/te) of the thickness tb of the piezoelectric layer 13a in the stress-relaxing portion 31 to the thickness te of the piezoelectric layer 13b in the central portion 30 and the maximum stress building up in the boundary portion between the ceramic layer 35 and the actuator body 11 in the laminated piezoelectric actuator shown in FIG. 3 for each of the laminated numbers of the piezoelectric layers 13a in the stress-relaxing portions 31.

The length of the central portion 30 in the direction of lamination, the number of the piezoelectric layers 13b laminated in the central portion 30 and the thickness of the internal electrode layers 15 are set to be constant.

It will be understood from the results of FIG. 9 that a maximum stress becomes smaller than about 13 MPa when the ratio (tb/te) of the thickness tb of the piezoelectric layers 13a in the stress-relaxing portion 31 to the thickness te of the piezoelectric layers 13b in the central portion 30 is from 1.3 to 2.5, a maximum stress becomes from 8 to 12 MPa when the thickness ratio (tb/te) is from 1.5 to 2.3, and a maximum stress becomes 8 MPa which is the smallest when the thickness ratio (tb/te) is about 1.9.

It will further be understood that the effect of relaxing the stress becomes great when the number of the layers laminated in the stress-relaxing portion 31 is from 6 to 24 layers, and the effect for relaxing the stress becomes the greatest when the number of the layers is from 6 to 12 layers.

The number of the piezoelectric layers 13a in the stress-relaxing portion 31 shown in FIG. 9 is that of either the upper part or the lower part of the actuator body 11.

Experimental Example 13

Figure 10:
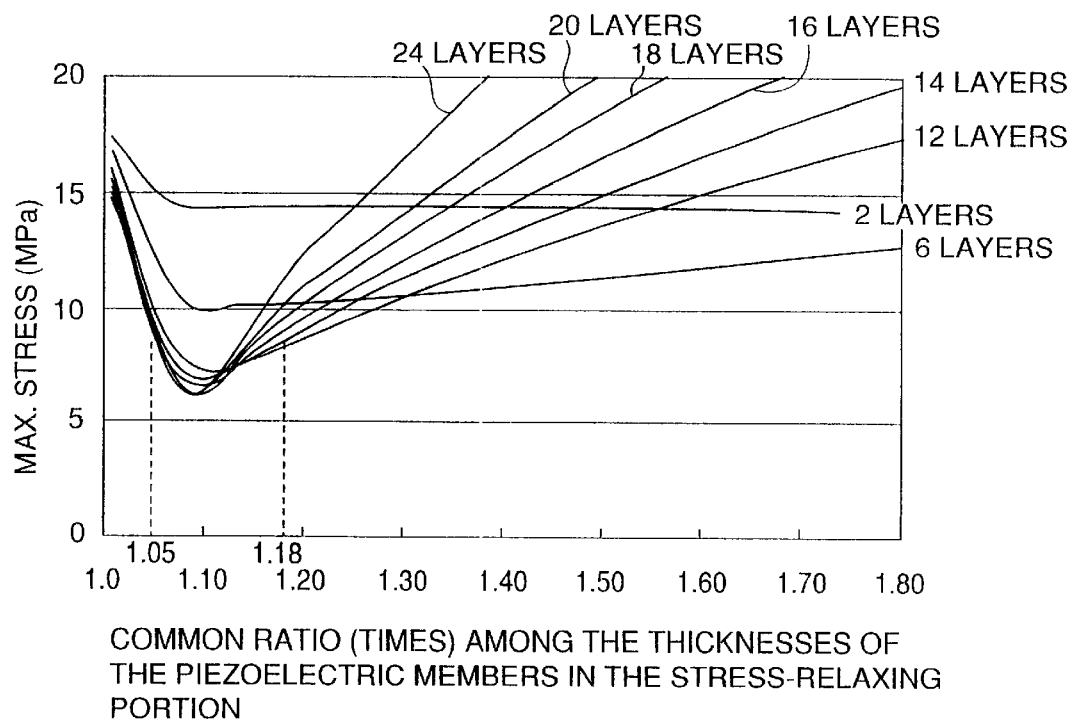
FIG. 10 is a graph illustrating a relationship between the ratio of increase when the thickness of the piezoelectric layer in the stress-relaxing portion is geometrically increased and a maximum stress building up in the boundary portion between the inert ceramic layer and the actuator body.

FIG. 10 illustrates the results of analysis of the relationship between the common ratio of when the thickness tb of the piezoelectric layers 13a in the stress-relaxing portion 31 is geometrically increased toward the side of the ceramic layer 35 and the maximum stress building up in the boundary between the ceramic layer 35 and the actuator body 11 for each of the laminated numbers of the piezoelectric layers 13a in the stress-relaxing portions 31 like in Experimental Example 12.

The thickness of the piezoelectric layer 13a at a position closest to the piezoelectric layer 13b in the central portion 30 is the common ratio times of the thickness of the piezoelectric layer 13b.

It will be understood from FIG. 10 that the maximum stress is not larger than about 13 MPa which is the smallest when the common ratio is from 1.05 to 1.18, and the effect for relaxing the stress becomes the greatest when the number of the layers laminated in the stress-relaxing portion 31 is from 6 to 24 layers. Further, the effect of relaxing the stress increases with an increase in the number of the layers that are laminated despite the common ratio is small.

Experimental Example 14

Figure 11:
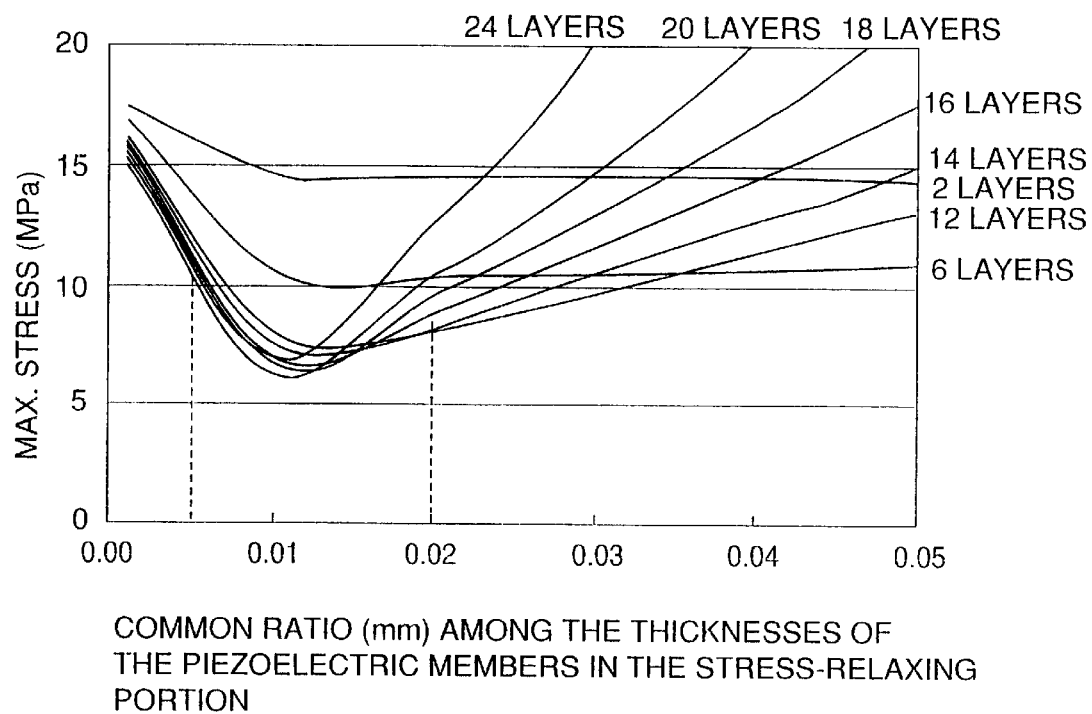
FIG. 11 is a graph illustrating a relationship between the difference in the thickness of when the thickness of the piezoelectric layer in the stress-relaxing portion is arithmetically increased and the maximum stress building up in the boundary portion between the inert ceramic layers and the actuator body.
Figure 12:
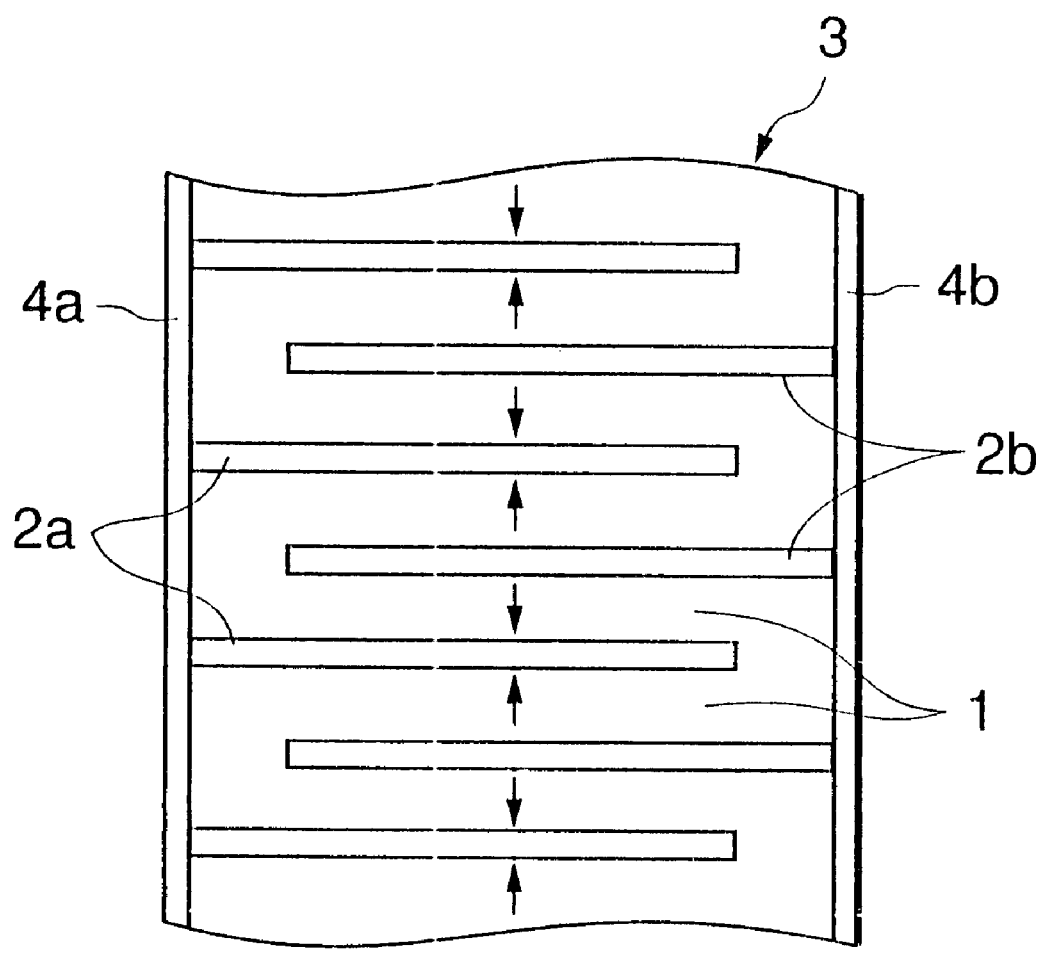
FIG. 12 is a side sectional view illustrating a portion of a conventional laminated piezoelectric actuator.

FIG. 11 illustrates the results of analysis of the relationship between the common difference of when the thickness tb of the piezoelectric layers 13a in the stress-relaxing portion 31 is arithmetically increased toward the side of the ceramic layer 35 and the maximum stress building up in the boundary between the ceramic layer 35 and the actuator body 11 for each of the laminated numbers of the piezoelectric layers 13a in the stress-relaxing portions 31 like in Experimental Example 12.

The thickness of the piezoelectric layer 13a at a position closest to the piezoelectric layer 13b in the central portion 30 is larger than the thickness of the piezoelectric layer 13b.

It will be understood from FIG. 11 that the maximum stress is not larger than about 13 MPa which is the smallest when the common difference is from 0.005 to 0.020 mm, and the effect for relaxing the stress becomes the greatest when the number of the layers laminated in the stress-relaxing portion 31 is from 6 to 24 layers. Further, the effect of relaxing the stress is very small when the number of the laminated layers is 2.

Experimental Example 15

A calcined powder of piezoelectric ceramics comprising chiefly PZT, an organic high-molecular binder and a plasticizer were mixed together to prepare a slurry which was then formed into a ceramic green sheet having a thickness of 150 μm by the slip-casting method.

An electrically conducting paste comprising chiefly silver-palladium that serves as an internal electrode layer 15 was printed on one surface of the green sheet by the screen-printing method maintaining a thickness of 5 μm, and was then dried. 100 Pieces of the green sheets on which the electrically conducting paste has been applied were laminated one upon the other, and the green sheets on which no electrically conducting paste has been applied were laminated in a number of 10 pieces on both ends of the laminate in the direction of lamination.

Next, the laminate was pressed and integrated while being heated at 100° C., and was then cut into a square pole measuring 10 mm×10 mm, heated at 800° C. for 10 hours to remove the binder, and was then fired at 1130° C. for 2 hours to obtain a laminated and sintered product. The thickness $t_2$ of the piezoelectric layers 13 was 120 μm.

Recessed portions were formed at the ends of the internal electrode layers 15 maintaining a depth (D) of 100 μm and a width (L) of 50 μm in the direction of lamination in the two side surfaces of the laminated sintered product so as to include the ends of the piezoelectric layers 13 maintaining a positional relationship shown in FIG. 1b, and the recessed portions were filled with a silicone rubber to form the insulating blocks 21.

Electrically conducting meshes comprising electrically conducting wires having a diameter of 0.25 times as large as the thickness ($t_2$) of the piezoelectric layer 13 and pitches p as shown in Table 9 were buried in the two side surfaces of the thus obtained actuator body 11, and were cured by heating at 200° C. to form an external electrode 17a for positive polarity and an external electrode 17b for negative polarity. The angle of the electrically conducting wires constituting the electrically conducting mesh was set to be 45 degrees (−45 degrees) relative to the direction of lamination.

Thereafter, lead wires were soldered to the external electrode 17a for positive polarity and to the external electrode 17b for negative polarity, the outer peripheral surfaces of the actuator was covered with silicone rubber by dipping, and a polarizing voltage of 1 kV was applied to polarize the whole actuator, thereby to obtain a laminated piezoelectric actuator.

When a DC voltage of 200 V was applied, the thus obtained laminated piezoelectric actuators all displaced by 10 μm. Further, AC electric fields of 0 to +200 V, 50 Hz, were applied to test these laminated piezoelectric actuators.

The laminated piezoelectric actuator was driven up to $1\times10^9$ cycles to measure the displacement and to examine a change from the initial displacement. The amount of displacement was measured by securing the sample onto a vibration-proof plate, sticking an aluminum foil onto the upper surface of the sample, and taking measurement at three places, i.e., at the central portion and at peripheral portions of the element by using a laser displacement meter to evaluate by an average value. The results were as shown in Table 1.

TABLE 9

| Sample No. | Pitch p/ thickness t2 of piezoelectric material | Change in the amount of displacement after $1\times10^9$ cycles |
| --- | --- | --- |
| 1 | 0.1 | amount of displacement has dropped to less than 5 μm after $1\times10^3$ cycles |
| 2 | 0.5 | normal |
| 3 | 1 | normal |
| 4 | 2 | normal |
| 5 | 4 | normal |
| 6 | 8 | normal |
| 7 | 10 | amount of displacement has dropped to less than 5 μm after $1\times10^5$ cycles |

As will be obvious from Table 9, in the samples Nos. 1 and 7 in which the pitch p of the electrically conducting wires was too large or too small relative to the thickness $t_2$ of the piezoelectric layer 13, the external electrodes were locally heated, the connection was broken between the internal electrodes and the external electrodes, and the amount of displacement has dropped to smaller than 5 μm. In the laminated piezoelectric actuators of the samples Nos. 2 to 6 using the electrically conducting wires (mesh) having a pitch p which was from 0.5 to 8 times of the thickness $t_2$ of the piezoelectric layer, on the other hand, no drop was recognized in the amount of displacement even after $1\times10^9$ cycles.

Experimental Example 16

The actuators were fabricated in the same manner as in Experimental Example 15 but selecting the pitch p of the electrically conducting wires to be the same as the thickness of the piezoelectric layer 13 and selecting the diameters of the electrically conducting wires to assume values as shown in Table 10 relative to the thickness $t_2$ of the piezoelectric layer 13. A DC voltage of 200 V was applied to the thus obtained laminated piezoelectric actuators. The actuators all exhibited a displacement of 10 μm. Further, AC electric fields of 0 to +200 V, 50 Hz, were applied to these laminated piezoelectric actuators to test them.

The laminated piezoelectric actuators were driven up to $1\times10^{10}$ cycles to measure the displacement and to examine changes from the initial displacement. The connection between the external electrodes and the internal electrodes was also observed. The results were as shown in Table 10.

TABLE 10

| | Diameter R/ | After $1\times10^{10}$ cycles testing | |
| --- | --- | --- | --- |
| Sample No. | thickness t2 of piezoelectric material | Change in the displacement | Connection between internal electrodes and external electrodes |
| 8 | 0.01 | normal | trace of sparking at connection portions |
| 9 | 0.05 | normal | normal |
| 10 | 0.1 | normal | normal |
| 11 | 0.5 | normal | normal |
| 12 | 1 | normal | normal |
| 13 | 2 | normal | normal |
| 14 | 4 | normal | trace of sparking at connection portions |

As will be obvious from Table 10, all samples exhibited no change in the amount of displacement even after the testing of $1\times10^{10}$ cycles. In the samples Nos. 8 and 14, however, the external electrodes were locally heated, and trace of sparking was recognized between the internal electrodes and the external electrodes. In the samples Nos. 9 to 13 in which the diameter R of the electrically conducting wires was selected to be from 0.05 to 2 times as great as the thickness $t_2$ of the piezoelectric material, on the other hand, the connection was favorable between the external electrodes and the internal electrodes after the cyclic testing, and the occurrence of sparking was not recognized at the connection portions.

What is claimed is:

1. A laminated piezoelectric actuator comprising (a) an actuator body constituted by plural piezoelectric layers and plural internal electrode layers alternatingly laminated in the direction of height, the internal electrode layers of one side constituting first electrode layers and the internal electrode layers of the other side constituting second electrode layers so as to be neighbored one another with said piezoelectric layers sandwiched among them, (b) external electrodes formed on the side surfaces of said actuator body and are connecting the ends of said internal electrode layers, and (c) non-active ceramic layers arranged at an upper end and a lower end of said actuator body; wherein said external electrodes include a first external electrode connecting the ends of the first electrode layers, and a second external electrode connecting the ends of the second electrode layers and is formed on a side surface of the actuator body different from the side surface on where the first external electrode is formed;

insulating blocks are arranged between the first external electrode and the ends of the second electrode layers, and between the second external electrode and the ends of the first electrode layers;

flat surfaces are formed on the side surfaces of said insulating blocks that are in contact with the ends of the first electrode layers and with the ends of the second electrode layers, the flat surfaces extending in parallel with the side surfaces of said actuator body; and when the thickness of said internal electrode layers is denoted by $t_1$, the thickness of said piezoelectric layers by $t_2$, and the length of said flat surfaces by L, a relation represented by the following formula, $$0.2 \leq (L-t_1)/t_2 < 1$$

is satisfied.

2. A laminated piezoelectric actuator according to claim 1, wherein the ratio of the dielectric constant $\in_2$ of said insulating blocks to the dielectric constant $\in_1$ in the polarizing direction of the piezoelectric layers satisfies the following formula, $$\in_2 \in_1 < 1.$$

3. A laminated piezoelectric actuator according to claim 1, wherein the radius R of curvature of corner portions where the upper surface and the lower surface of the insulating block are continuous to the flat surface satisfies the following formula, $$0.05 t_2 \leq R \leq 0.3 t_2$$

where $t_2$ is a thickness of the piezoelectric layers.

4. A laminated piezoelectric actuator according to claim 1, wherein said external electrodes are formed of an electrically conducting composition comprising a resin matrix of a heat-resistant resin having a 5%-weight-reduction temperature of not lower than 250° C. and at least one kind of electrically conducting agent selected from the group consisting of electrically conducting ceramics, a metal oxide, a metal of the Groups 6 to 11 of periodic table or an alloy thereof, said electrically conducting agent being dispersed in an amount of from 15 to 80% by volume per the total amount of the composition.

5. A laminated piezoelectric actuator according to claim 4, wherein said heat-resistant resin has a modulus of elasticity of not larger than 2000 kgf/cm$^2$ and a ductility of not smaller than 10%.

6. A laminated piezoelectric actuator according to claim 4, wherein said heat-resistant resin is a polyimide or a polyamideimide.

7. A laminated piezoelectric actuator according to claim 4, wherein said heat-resistant resin has a glass transition point of not lower than 180° C.

8. A laminated piezoelectric actuator according to claim 1, wherein said external electrodes are formed by sticking electrically conducting thin plates or meshes onto the side surfaces of the actuator body using an electrically conducting composition as an adhesive.

9. A laminated piezoelectric actuator according to claim 8, wherein said electrically conducting mesh is formed of electrically conducting wires arranged maintaining a pitch which is from 0.5 to 8 times as large as the thickness of said piezoelectric layers.

10. A laminated piezoelectric actuator according to claim 1, wherein said actuator body contains three regions consisting of a central portion and stress-relaxing portions located over and under the central portion in the direction of lamination, said non-active ceramic layers are provided neighboring said stress-relaxing portions, every region in the actuator body includes plural piezoelectric layers, and the piezoelectric layers in the stress-relaxing portions have a thickness larger than that of the piezoelectric layers in the central portion.

11. A laminated piezoelectric actuator according to claim 10, wherein the plural piezoelectric layers included in said stress-relaxing portions have the same thickness which is from 1.3 to 2.5 times as large as the thickness of the piezoelectric layers in the central portion.

12. A laminated piezoelectric actuator according to claim 10, wherein the plural piezoelectric layers in said stress-relaxing portions have thicknesses that increase toward the ceramic layers.

13. A laminated piezoelectric actuator according to claim 12, wherein the plural piezoelectric layers in said stress-relaxing portions have a thickness of from 1.05 to 1.18 times as large as the thickness of the piezoelectric layers neighboring the central portion.

14. A laminated piezoelectric actuator according to claim 12, wherein the plural piezoelectric layers in said stress-relaxing portions have a thickness larger by 0.005 to 0.020 mm than the thickness of the piezoelectric layers neighboring the central portion.

15. A laminated piezoelectric actuator according to claim 10, wherein 6 to 24 piezoelectric layers are included in each of said stress-relaxing portions.

* * * * *